United States Patent
Yoshimura et al.

(10) Patent No.: US 7,005,755 B2
(45) Date of Patent: Feb. 28, 2006

(54) SEMICONDUCTOR DEVICE AND FABRICATION PROCESS THEREOF

(75) Inventors: Tetsuo Yoshimura, Kawasaki (JP); Shinji Kuzuya, Kawasaki (JP); Kazuo Sukegawa, Kawasaki (JP); Tetsuo Izawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 31 days.

(21) Appl. No.: 10/745,645

(22) Filed: Dec. 29, 2003

(65) Prior Publication Data

US 2004/0135226 A1 Jul. 15, 2004

Related U.S. Application Data

(60) Division of application No. 10/231,046, filed on Aug. 30, 2002, now Pat. No. 6,706,610, which is a continuation of application No. PCT/JP00/01435, filed on Mar. 9, 2000.

(51) Int. Cl.
*H01L 23/544* (2006.01)

(52) U.S. Cl. .................................. 257/797; 257/283
(58) Field of Classification Search ............. 257/797, 257/283
See application file for complete search history.

(56) References Cited

U.S. PATENT DOCUMENTS

| 5,286,673 A | 2/1994 | Nishihara | 438/427 |
| 5,369,050 A | 11/1994 | Kawai | 437/62 |
| 5,909,626 A * | 6/1999 | Kobayashi | 438/406 |
| 6,194,287 B1 | 2/2001 | Jang | 438/427 |
| 6,215,197 B1 | 4/2001 | Iwamatsu | 257/797 |
| 6,303,460 B1 | 10/2001 | Iwamatsu | 438/401 |
| 6,440,816 B1 | 8/2002 | Farrow et al. | 438/401 |

FOREIGN PATENT DOCUMENTS

| EP | 000513684 A2 | 11/1992 |
| JP | 4-78123 | 3/1992 |
| JP | 9-232207 | 9/1997 |
| JP | 11-67894 | 3/1999 |
| WO | WO 01/67509 A1 | 9/2001 |

* cited by examiner

*Primary Examiner*—Craig A. Thompson
(74) *Attorney, Agent, or Firm*—Armstrong, Kratz, Quintos, Hanson & Brooks, LLP

(57) ABSTRACT

A semiconductor device formed on a SOI substrate includes isolation trenches formed in a first region and reaching an insulation layer buried in the SOI substrate, and alignment marks formed in a second region and consisting of grooves extending into a support substrate.

5 Claims, 22 Drawing Sheets

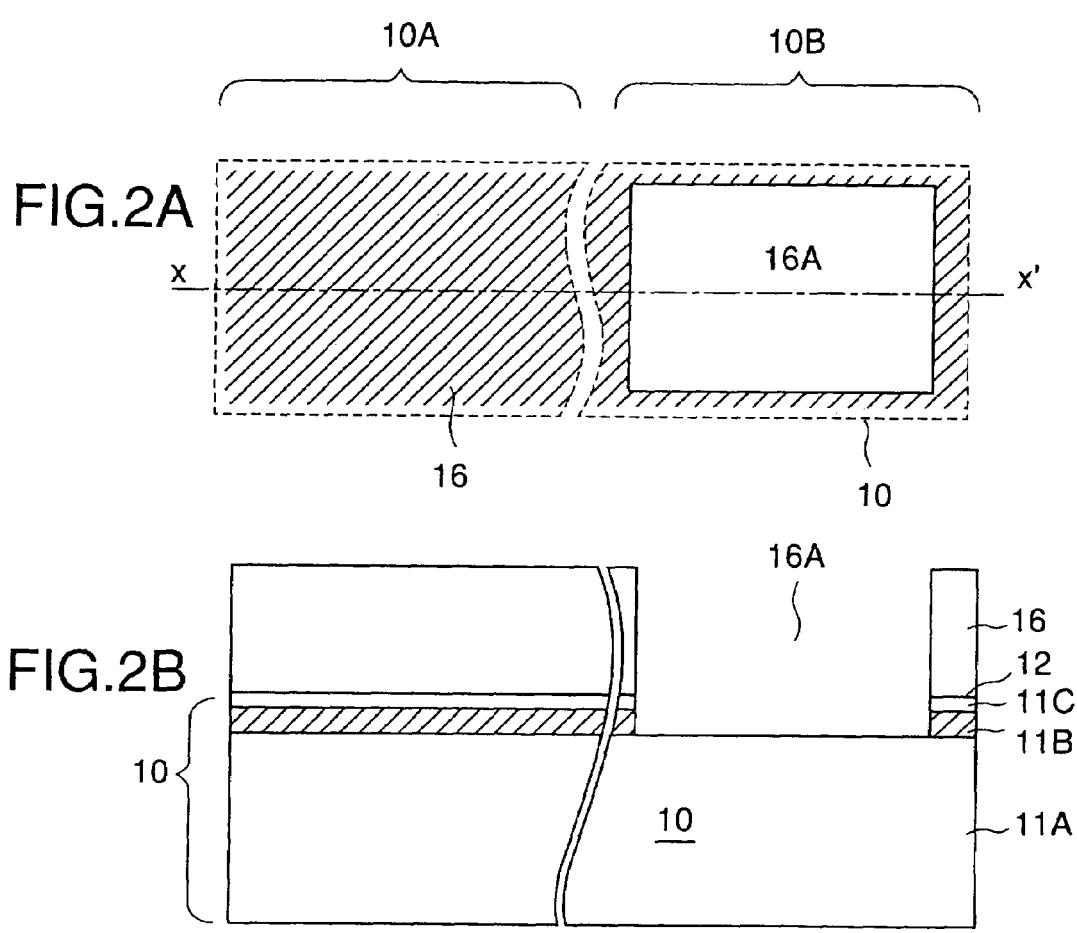

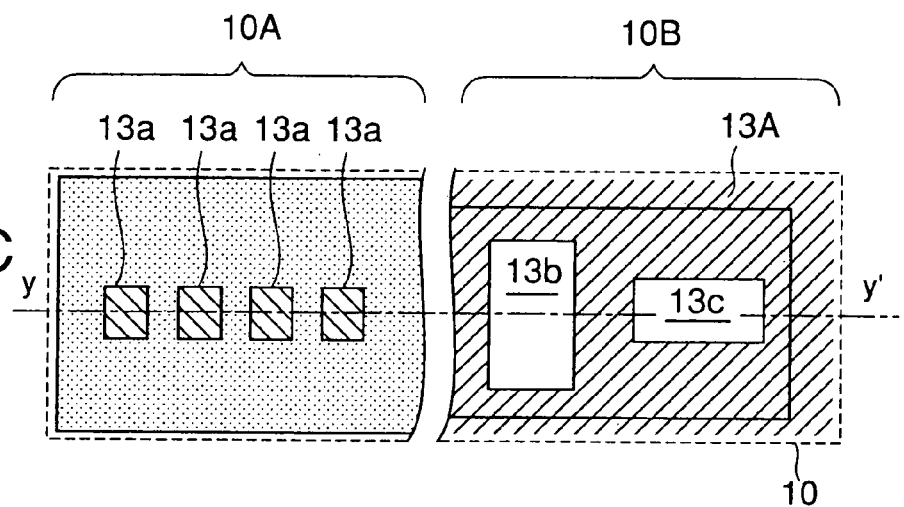
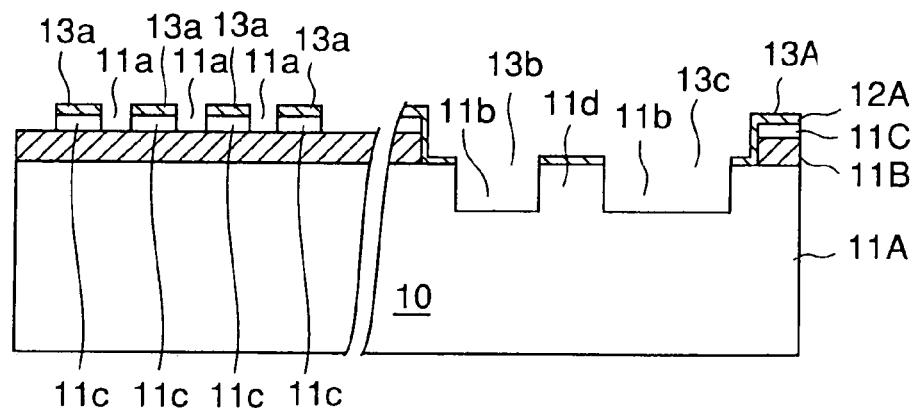

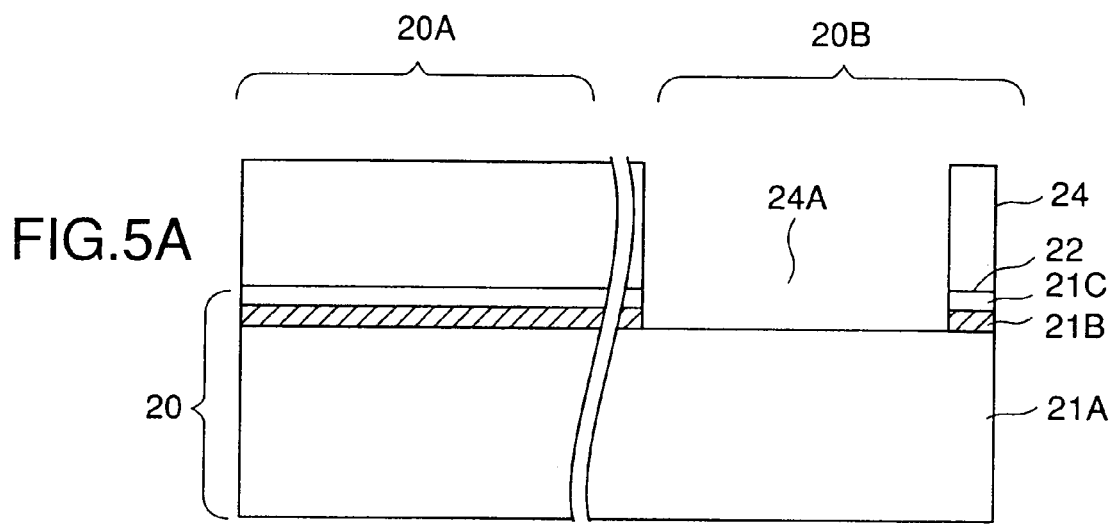
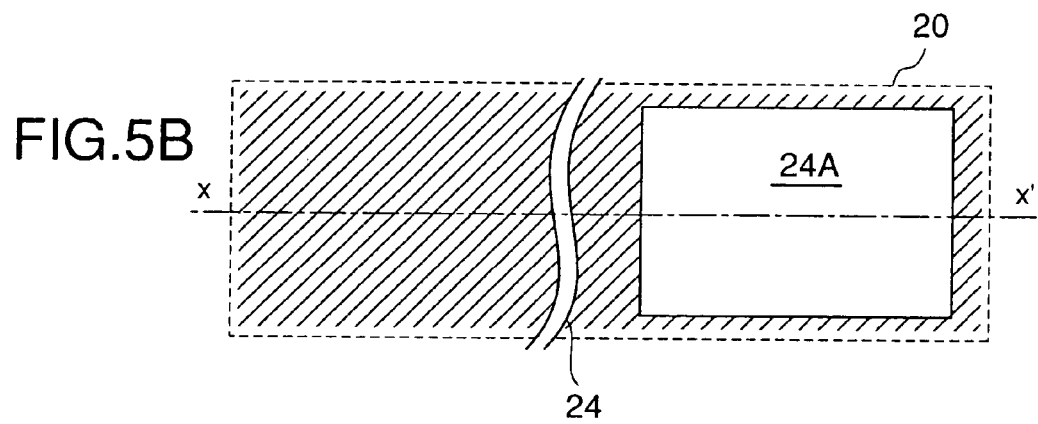

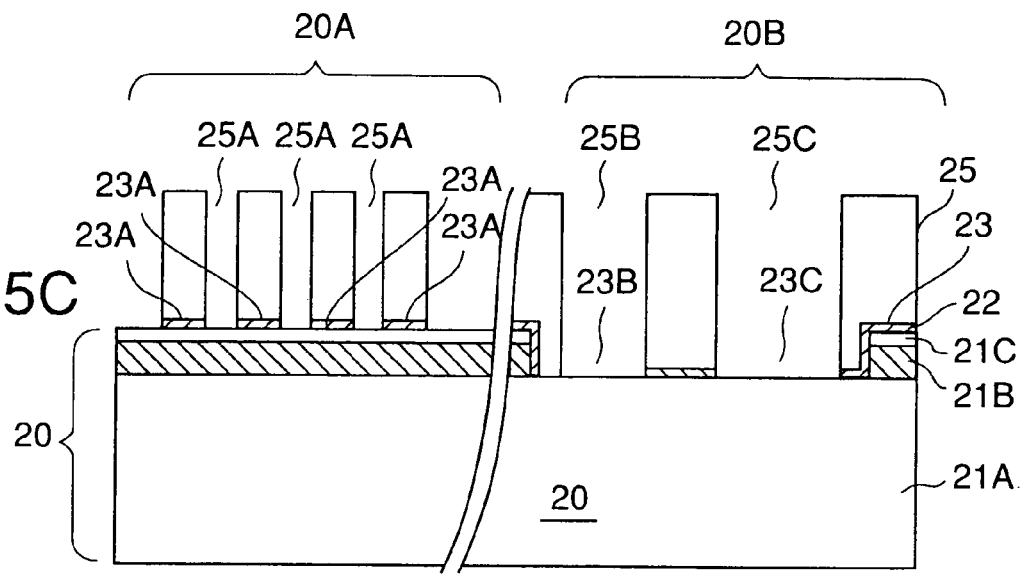
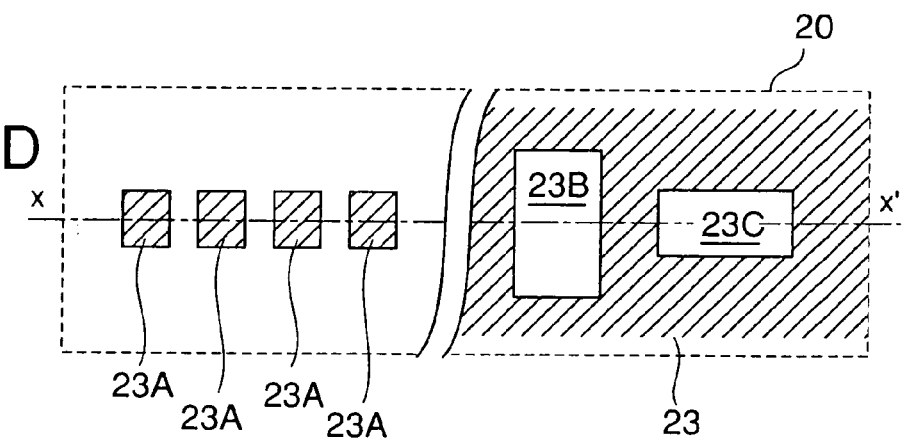

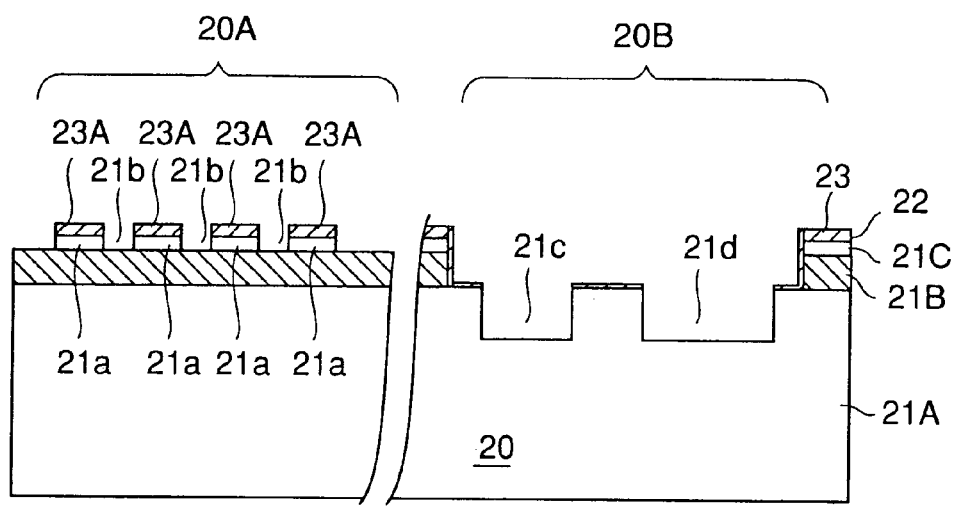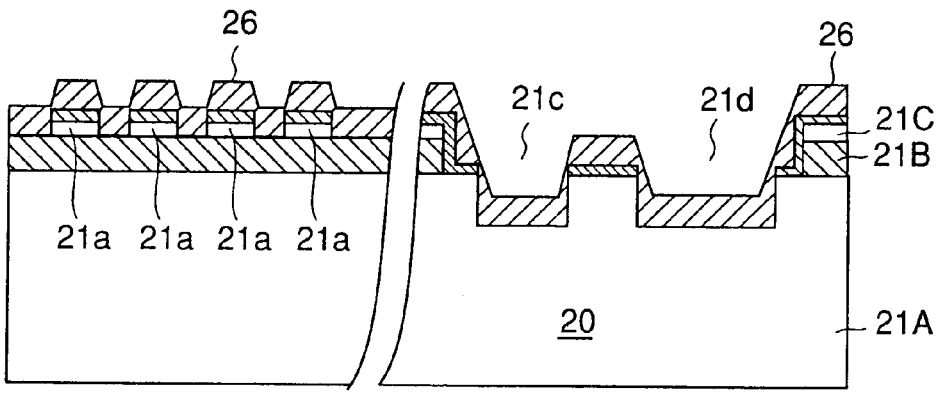

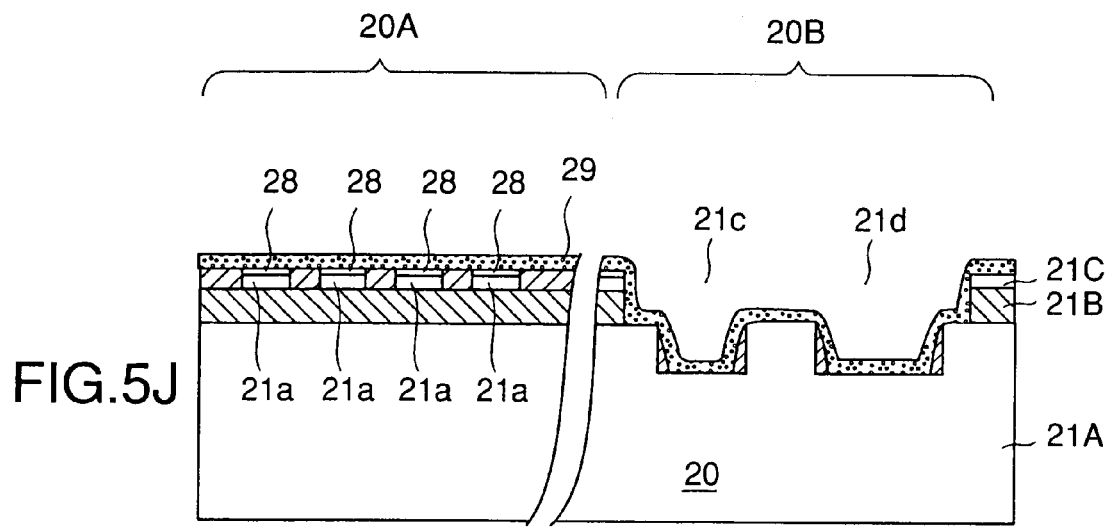
FIG.5J
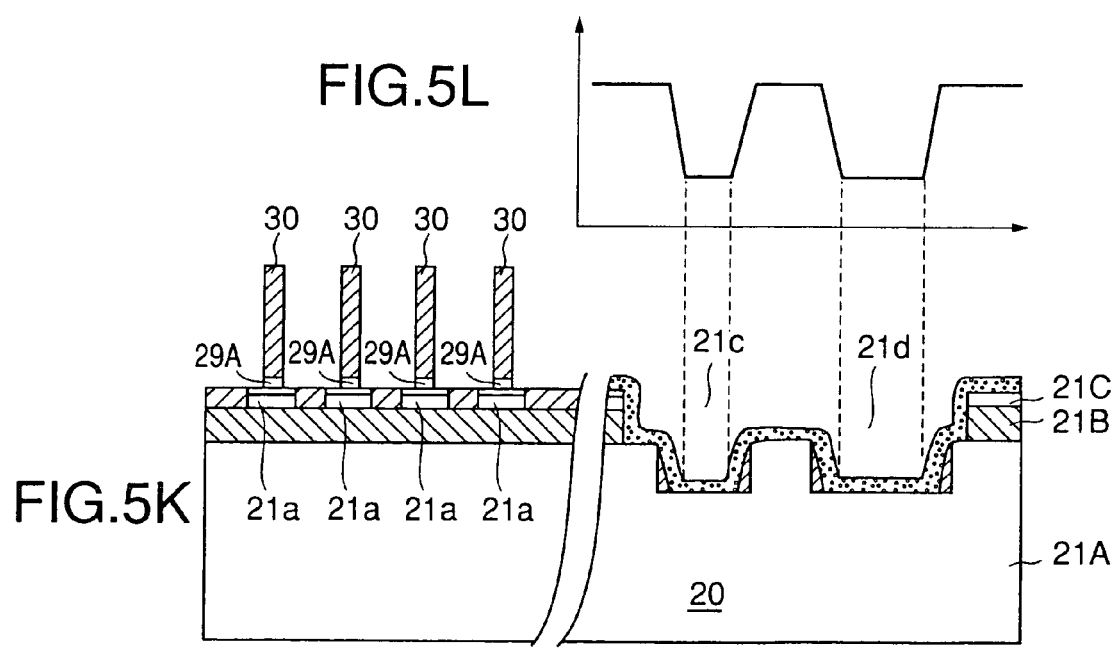
FIG.5L
FIG.5K

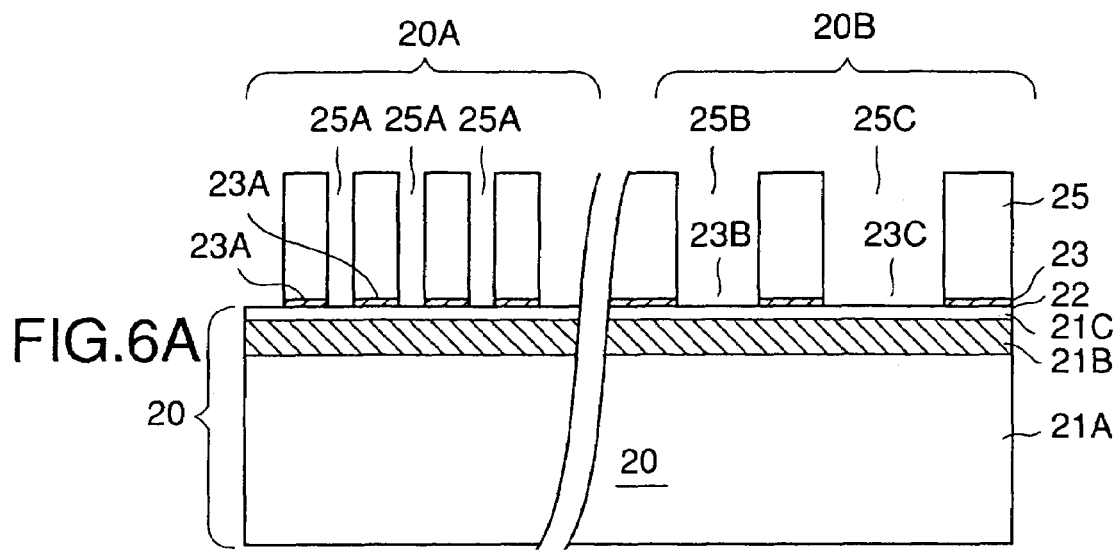
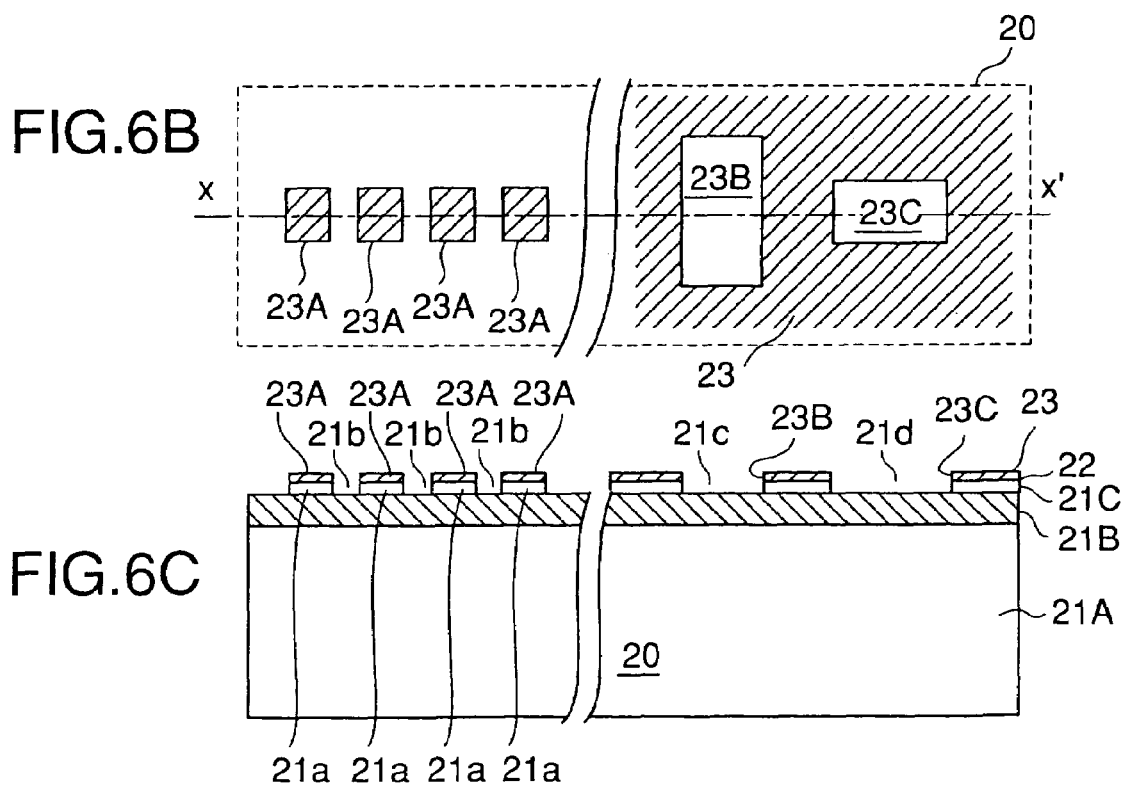

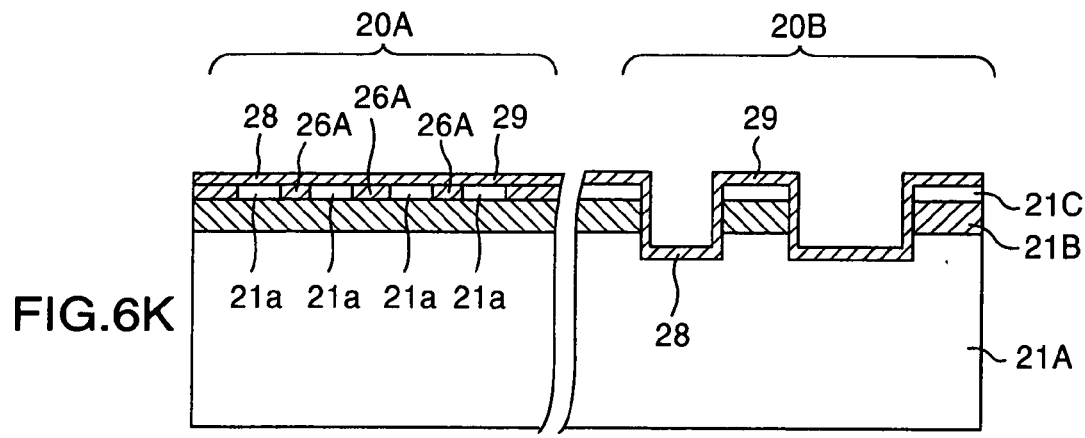
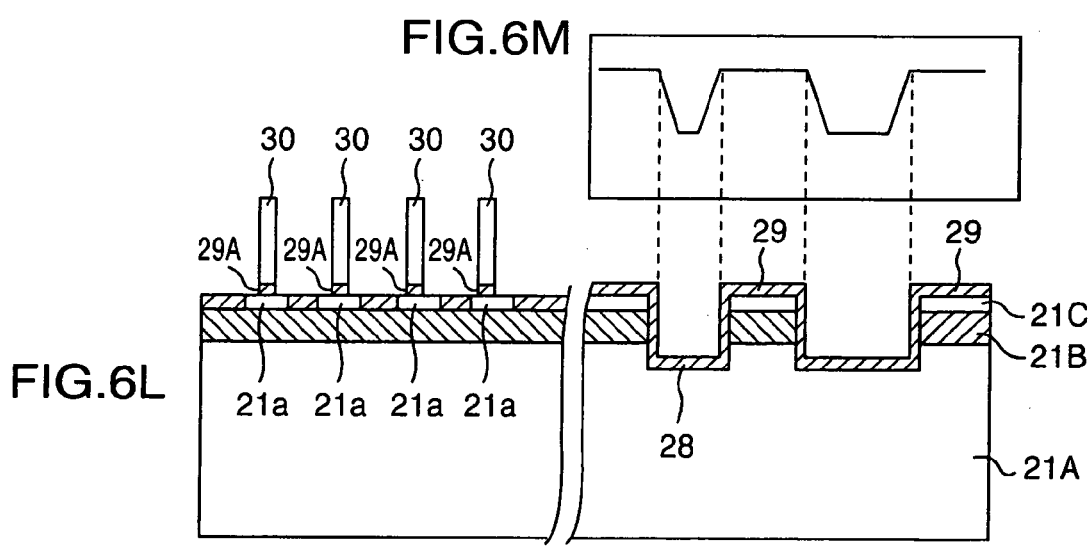

SEMICONDUCTOR DEVICE AND FABRICATION PROCESS THEREOF

This application is a Divisional of prior application Ser. No. 10/231,046 filed on Aug. 30, 2002 now U.S. Pat. No. 6,706,610 which is a continuation of International Application PCT/JP00/01435 filed on Mar. 9, 2000.

TECHNICAL FIELD

The present invention generally relates to production of semiconductor devices and more particularly the process of fabricating a semiconductor device including the step of forming a groove-type device isolation structure (STI: shallow trench isolation) on a so-called SOI (silcon-on-insulator) substrate. Further, the present invention relates to a semiconductor device fabricated by such a process.

Various techniques are used in the semiconductor devices that are subjected to the demand of high-speed operation, for improving the operational speed. Device miniaturization based on scaling law is a representative example. In addition, there is a proposal of using a semiconductor substrate having a so-called SOI structure, in which buried insulation layer is formed under a semiconductor layer forming an active layer, so as to decrease the parasitic capacitance of the diffusion regions that are formed in the active layer.

Meanwhile, various alignment marks are used in such highly miniaturized high-speed semiconductor devices when patterning various layers. Especially the patterning of a gate electrode, which exerts a decisive influence on the operational speed of the semiconductor device, is conducted by using an ultra-high resolution exposure apparatus, such as an electron beam exposure apparatus, in the case of so-called sub-quarter micron semiconductor devices having a gate length of less than 0.25 $\mu$m. As patterning of other layers is carried out by using an optical exposure apparatus that provides a large throughput, there is a demand in such advanced, ultrafine semiconductor devices, to form an alignment mark detectable by an electron beam exposure apparatus in advance, so as to align the gate electrode pattern to be formed accurately at the time of patterning of the gate electrode.

BACKGROUND ART

FIGS. 1A–1I show the process of forming a gate alignment mark in the fabrication process of a conventional ultrafine semiconductor device.

Referring to FIG. 1A, the ultrafine semiconductor device is formed on an SOI substrate 10 in which an $SiO_2$ buried insulation layer 11B having a thickness of typically 400 nm and a single crystal Si active layer 11C having a thickness of typically 500 nm are formed consecutively on a support substrate 11A of Si, and the like. Thereby, formation of the gate alignment mark is conducted simultaneously to the formation of the device isolation structure of the STI (shallow trench isolation) structure.

More specifically, a device array region 10A, in which the STI device isolation structure is formed, and an alignment mark forming region 10B, in which the gate alignment marks are formed, are defined on the SOI substrate 10 in the process of FIG. 1A. The device array region 10A and the alignment mark forming region 10B are covered by an $SiO_2$ film 12 having a thickness of about 10 nm and an SiN film 13 having a thickness of about 110 nm. For example, the $SiO_2$ film 12 may be formed by a hydrochloric acid oxidation process conducted at 900° C. On the other hand, a CVD process is used to form the SiN film 13.

Next, a resist pattern 14 shown in FIG. 1C is formed on the structure of FIG. 1A in the process of FIG. 1B, and the SiN film 13 and the $SiO_2$ film 12 underneath the SiN film 13 are patterned while using the resist pattern 14 as a mask. With this, $SiO_2$ patterns 12A and SiN patterns 13A are formed on the Si active layer 11C as shown in FIG. 1C. Referring to FIGS. 1B and 1C, the SiN pattern 13A includes patterns 13a that cover the device region of the semiconductor device in the device array region 10A. Further, the SiN pattern 13A includes mask openings 13b and 13c corresponding to the alignment marks to be formed in the alignment mark formation region 10B. The mask openings 13b and 13c are formed in correspondence to the resist openings 14A and 14B of the resist pattern 14.

Thus, in the step of FIG. 1D, device isolation grooves 11a are formed in the active layer 11C in correspondence to the device array region 10A by patterning the Si active layer 11C by a dry etching process while using the SiN pattern 13A as a hard mask. Simultaneously, alignment marks 11b are formed in the active layer 11C of the alignment mark formation region 10B in the form of grooves. It should be noted that the dry etching process is conducted, when forming the device isolation grooves 11a and the alignment marks 11b, until the buried $SiO_2$ insulation film 11B is exposed. As a result of the patterning process, there are formed device regions 11c of Si in the device array region 10A between a device isolation groove 11a and a next device isolation groove 11a. In the alignment mark formation region 10B, on the other hand, Si regions 11d are formed between a pair of mutually adjacent grooves. It should be noted that the Si region 11d forms the alignment mark together with the grooves 11b.

Next, in the step of FIG. 1E, an $SiO_2$ film 15 is deposited on the structure of FIG. 1D by a CVD process such that the $SiO_2$ film 15 covers the device region 11c or the Si region 11d with a thickness of about 700 nm. Further, in the step of FIG. 1F, the $SiO_2$ film 15 is polished by a CMP process while using the SiN pattern 13A as a polishing stopper. Further, in the step of FIG. 1G, the SiN pattern 13A and also the $SiO_2$ pattern 12A underneath the SiN pattern 13A are removed respectively by using a pyrolytic phosphoric acid and an HF etchant. In the step of FIG. 1E, the $SiO_2$ film 15 fills the grooves 11a and 11b, and as a result, there are formed device isolation insulation film patterns 15A in the step of FIG. 1G in the device array region 10A in correspondence to the device isolation grooves 11a. Thereby, it should be noted that a device region 11c is formed between a pair of neighboring device isolation film patterns 15A. Also, in the alignment mark formation region 10B, the $SiO_2$ patterns 15B are formed in correspondence to the grooves 11b, such that $SiO_2$ patterns sandwich the Si pattern 11d laterally.

Next, in the step of FIG. 1H, a resist pattern 16 exposing the alignment mark formation region 10B of FIG. 1I is formed such that the resist pattern 16 covers the structure of FIG. 1G, and the $SiO_2$ pattern 15B is removed in the alignment mark formation region 10B by a dry etching process that uses a $CHF_3/CF_4$ mixed gas as an etching gas for example, while using the resist pattern 16 as a mask. By removing the resist pattern 16, a structure in which the device regions 11c are separated from each other by the device isolation regions 15A, is formed in the device array region 10A. Also, an alignment mark having a planar form explained previously with reference to FIG. 1C is formed in the alignment mark formation region 10B such that the alignment mark is formed of the Si patterns 11d and the grooves lie formed adjacent to the Si patterns 11d in correspondence to the SiO$_2$ patterns 15B. It should be noted that FIG. 1H is a cross-sectional diagram taken along a line x–x' of FIG. 1I.

In such a semiconductor device of the conventional construction, it should be noted that the gate electrode pattern is formed on the device region 11c in the array region 10A by using a ultra high resolution exposure method including an electron beam exposure method as explained previously. Thereby, a Si pattern 11d in the alignment mark formation region 10B is used as an alignment mark, and alignment of the exposure apparatus is achieved by detecting the step height associated with the Si pattern 11d. According to the conventional construction noted above, the formation of the alignment mark and the formation of the device isolation region are conducted simultaneously by using the same mask. Because of this, it is possible to form the gate electrode with high precision.

On the other hand, it is required that the Si pattern 11d forms a sufficiently large step height in order that the alignment mark can be detected by an ultra high resolution exposure apparatus. In the case of using an electron beam exposure apparatus, it is necessary that a step height of at least 500 nm is formed. Because of this, it has been conventionally practiced to set the thickness of the Si layer 11C to about 700 nm as explained previously.

On the other hand, with further advance of miniaturization in such conventional semiconductor devices, it will be noted that the pitch of the openings in the resist pattern 14 used in the process of FIG. 1B is reduced particularly in the device array region 10A, and as a result, the interval between the SiN patterns 13a in FIG. 1C, and hence the interval between the Si device regions 11c in FIG. 1D, is reduced. However, the aspect ratio of the device isolation groove 11a formed between the Si device regions 11c is inevitably increased in such a miniaturized structure, when an attempt is made to secure a step height of about 500 nm for the Si pattern 11d in the alignment mark formation region 10B. When this is the case, there may be a problem that the deposited CVD layer 15 cannot fill the groove 11a completely in the step of FIG. 1E and a void may be formed inside. As such a void can induce various levels on the surface thereof, there can be a case in which the device isolation structure cannot provide the desired device isolation performance especially in the case the device is miniaturized further. For example, the aspect ratio of 1 in the structure of FIG. 1D for the case in which the width of the device isolation groove 11a is set to 0.5 μm, increases to the value of 2.5 when the width of the groove 11a is reduced to 0.2 μm.

In order to resolve this problem, it is necessary to reduce the thickness of the Si active layer 11C. In such a case, however, the step height of the Si pattern 11d forming the alignment mark is reduced correspondingly, and as a result, the necessary alignment cannot be achieved when the substrate is loaded in an electron beam exposure apparatus.

In view of this situation note above, it may be conceivable to use a mask different from the one used for forming the grooves 11b in the alignment mark formation region 10B, for forming the device isolation groove 11a in the device array region 10A, in the approach of decreasing the thickness of the Si active layer 11C. In this case, the device isolation grooves 11a and the grooves 11b are formed separately by using different masks and the grooves 11b can have a sufficient depth, such as the one reaching the SiO$_2$ layer 11B. However, there arises a problem, in such a process of forming the device isolation grooves 11a and the grooves 11b forming the alignment mark by using separate masks, in that the positioning accuracy at the time of forming the gate electrode pattern on the device region 11a is inevitably deteriorated because of the need of alignment of these different masks.

DISCLOSURE OF THE INVENTION

Accordingly, the present invention provides a novel and useful semiconductor device and a fabrication process thereof wherein the foregoing problems are eliminated.

Another and more specific object of the present invention is to provide a process of fabricating a semiconductor device that uses an SOI substrate, wherein the same mask is used for forming a device isolation region and an alignment mark on the SOI substrate, and wherein the alignment mark is formed to have a sufficient step height.

Another object of the present invention is to provide a semiconductor device, comprising:

a composite semiconductor substrate formed of a support substrate, a buried insulation layer formed on the support substrate, and a semiconductor layer formed on the buried insulation layer;

a device isolation groove formed on a first region of the composite semiconductor substrate so as to expose the buried insulation layer;

a device isolation insulation film filling the device isolation groove; and an alignment groove formed in a second region of the composite semiconductor substrate as an alignment mark so as to reach at least the support substrate.

Another feature of the present invention is to provide a process of fabricating a semiconductor device, comprising the steps of:

patterning, in a first region of a composite semiconductor substrate, the composite semiconductor substrate being formed of a support substrate, a buried insulation layer formed on the support substrate and a semiconductor layer formed on the buried insulation layer, the semiconductor layer and the buried insulation layer by using a first mask pattern such that the support substrate is exposed;

forming, on the support substrate, a second mask pattern such that the second mask pattern has a first opening in the first region in correspondence to an alignment mark to be formed and such that the second mask pattern has a second opening in a second region in correspondence to a device isolation groove to be formed, such that the second mask pattern covers the support substrate exposed in the first region and such that the second mask pattern covers the semiconductor layer in the second region; and patterning the semiconductor layer and the support substrate simultaneously while using the second mask pattern as a mask, to form the alignment mark in the first region in the form of a groove cutting into the support substrate and further the device isolation groove in the second region in the form of a groove exposing the buried insulation layer.

Another feature of the present invention is to provide a fabrication process of a semiconductor device, comprising the steps of:

forming, on a composite semiconductor substrate formed of a support substrate, an insulation layer formed on the support substrate and a semiconductor layer formed on the insulation layer, a first mask pattern having a first mask opening in a first region in correspondence to an alignment mark pattern to be formed and a second mask opening in a second region in correspondence to a device isolation groove to be formed, such that the first mask pattern covers the semiconductor layer;

patterning the semiconductor layer while using the first mask pattern as a mask, to form the device isolation groove in correspondence to the second mask opening in the second region and an opening in the first region in correspondence to the first mask opening;

forming a second mask pattern of an insulation film in a self-alignment process, by filling the openings corresponding to the device isolation groove and the first mask opening with the insulation film;

removing the first mask pattern;

forming, after the step of removing the first mask pattern, a third mask pattern on the composite semiconductor substrate so as to cover the second region such that the third mask pattern has an opening exposing the first region; and forming a groove in the first region in correspondence to the first mask opening as the alignment mark pattern while using the second and third mask patterns as a mask, such that the groove reaches the support substrate.

According to the present invention, the aspect ratio of the device isolation groove is maintained small even in the case the semiconductor device is miniaturized, by decreasing the thickness of the semiconductor layer in the composite semiconductor substrate, and it becomes possible to fill the device isolation groove by the device isolation insulation film, without causing formation of defects. Thereby, it should be noted that the same mask is used for the mask for forming the device isolation groove and the mask for forming the alignment mark in the present invention, and a sufficient depth is secured for the alignment mark by forming the alignment mark in the form of the grooves cutting into the support substrate. As a result, an ideal positional alignment is achieved between the device region in the device isolation region formation region and the alignment mark because of the fact that the mask used for forming the device isolation groove and the mask used for forming the alignment mark are identical in the present invention.

Other features and advantages of the present invention will become apparent from the explanation below of the preferred embodiments of the present invention when read in conjunction with the drawings.

BRIEF EXPLANATION OF THE DRAWINGS

FIGS. 2A–2D are diagrams showing the principle of the present invention;

FIGS. 5A–5L are diagrams explaining the process of fabricating a semiconductor device according to a first embodiment of the present invention;

FIGS. 6A–6M are diagrams explaining the process of fabricating a semiconductor device according to a second embodiment of the present invention.

BEST MODE FOR IMPLEMENTING THE INVENTION

[Principle]

Figure 1A:
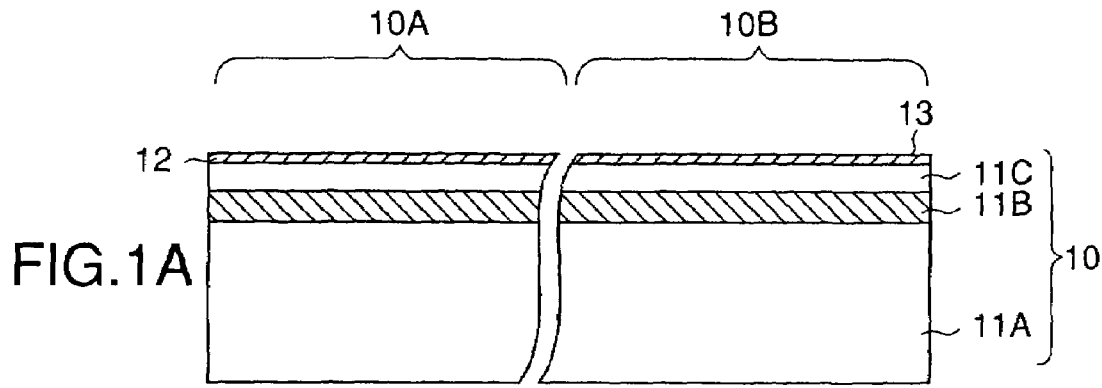
FIGS. 1A–1I are diagrams showing the process of fabricating a conventional semiconductor device.

First, the principle of the present invention will be explained with regard to a first mode of the present invention with reference to FIGS. 2A–2D, wherein those parts explained previously are designated by the same reference numerals and the explanation thereof will be omitted.

Figure 1B:
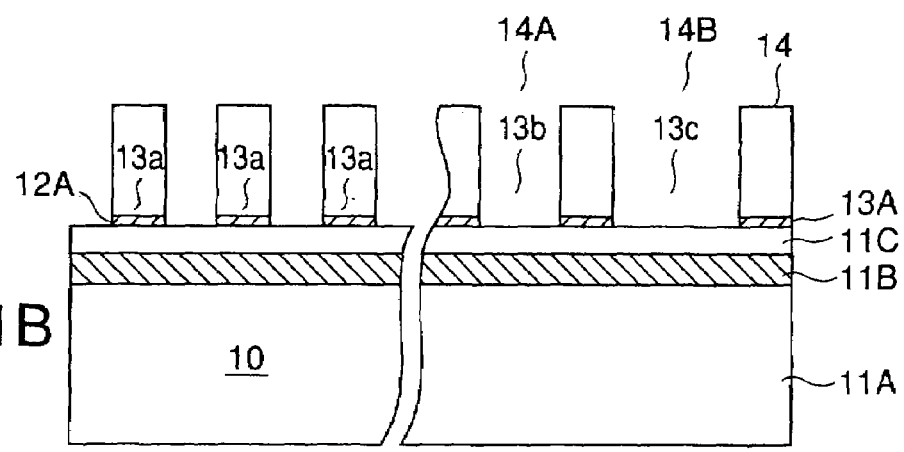
Figure 1C:
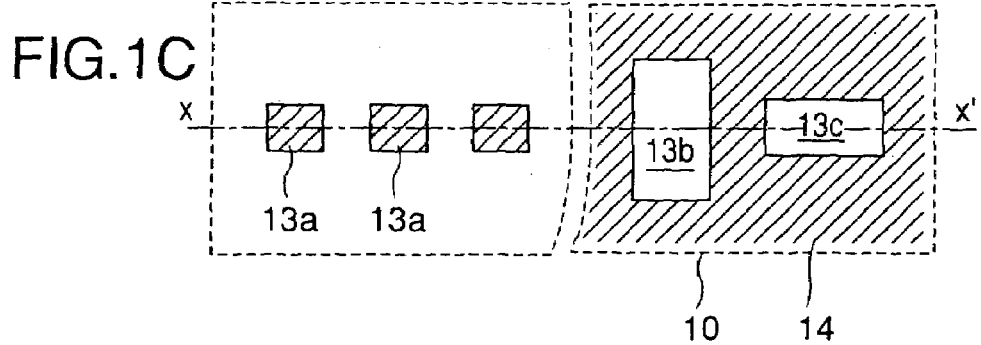
Figure 1D:
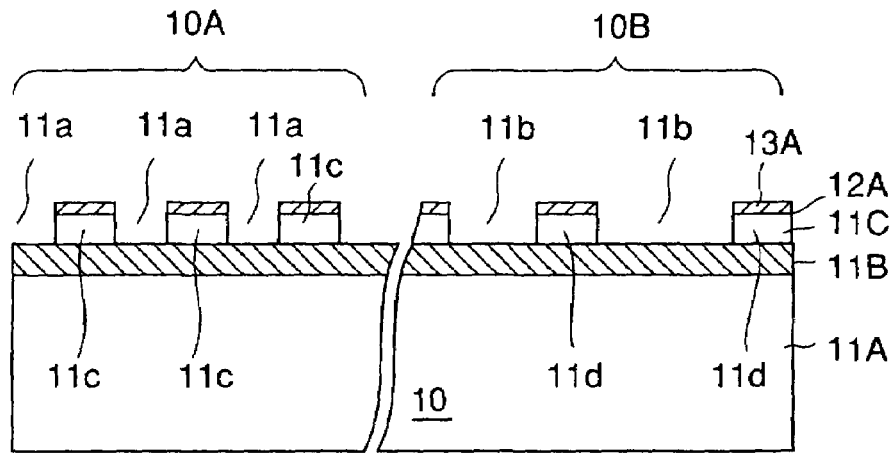
Figure 1E:
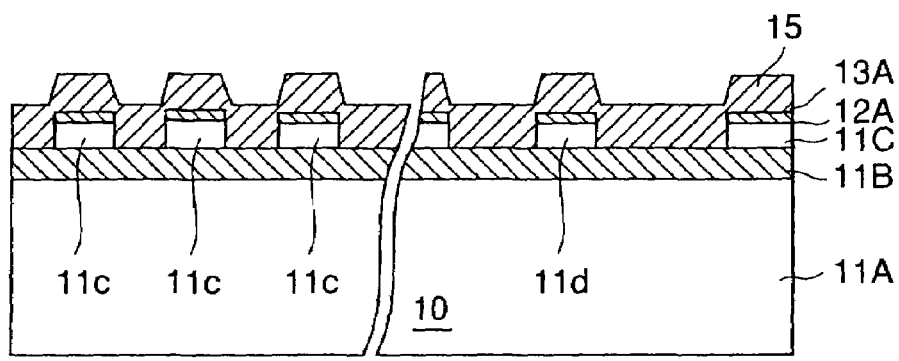
Figure 1F:
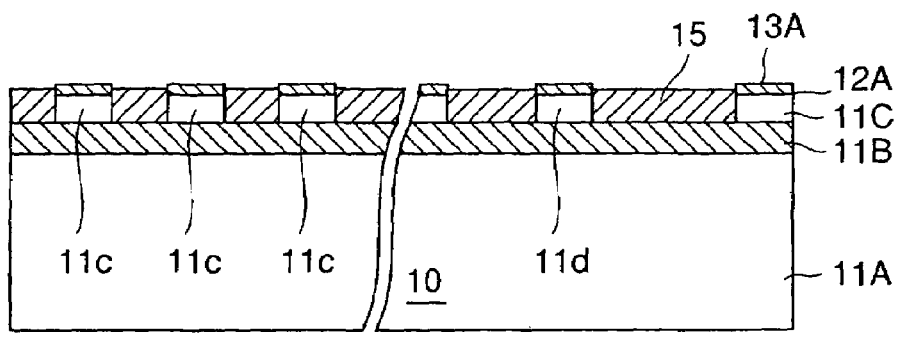
Figure 1G:
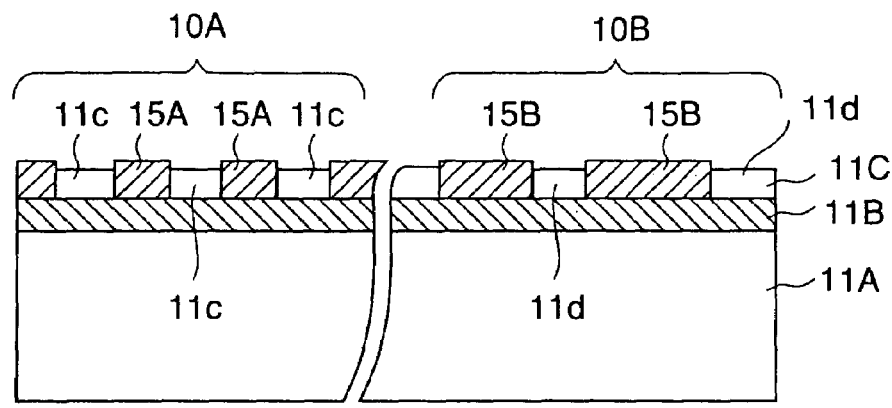
Figure 1H:
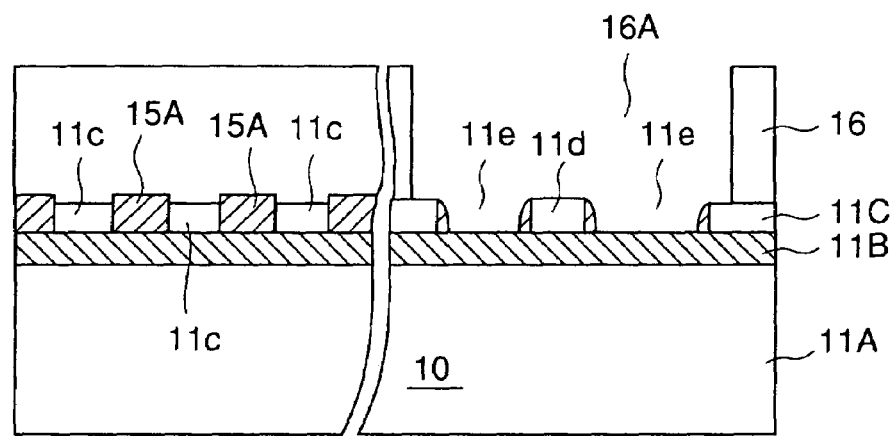
Figure 1I:
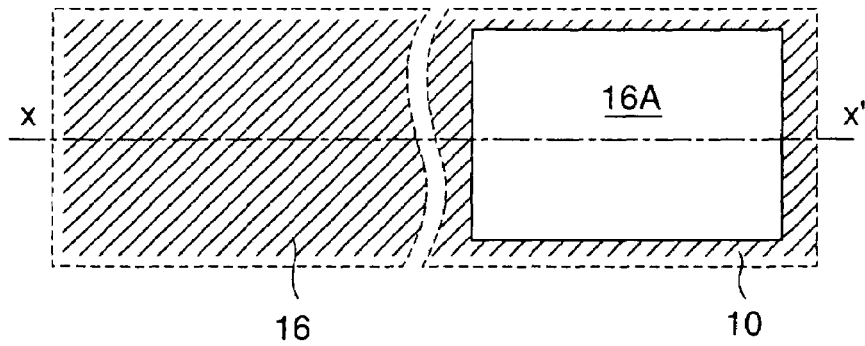

Referring to FIGS. 2A and 2B at first, a resist pattern 16 explained with FIG. 1I is formed on a structure similar to the one explained previously with reference to FIG. 1A, and the $SiO_2$ film 12 is patterned while using the resist pattern 16 as a mask. Thereby, the $SiO_2$ patterns 12A are formed. In the structure of FIGS. 2A and 2B, it should be noted that the thickness of the active layer 11C is set smaller, to the order 100–150 nm, as compared with the conventional case, in correspondence to the miniaturization of the device. On the other hand, the $SiO_2$ buried insulation layer 11B has the thickness of about 400 nm. In the step of FIGS. 2A and 2B, the SiN film 13 is not formed on the $SiO_2$ film 12. It should be noted that FIG. 2B is a cross-sectional view taken along the line x–x' of FIG. 2A.

In the step of FIGS. 2A and 2B, the resist pattern 16 exposes the $SiO_2$ film 12 in the resist opening 16A corresponding to the alignment mark formation region 10B, and a structure exposing the Si support substrate 11A in the alignment mark formation region 10B is obtained as shown in FIG. 2B, by consecutively patterning the $SiO_2$ film 12, the Si active layer 11C underneath the $SiO_2$ film 12 and further the $SiO_2$ buried insulation layer 11B underneath the Si active layer 11C, while using the resist pattern 16 as a mask.

Next, the resist pattern 16 is removed from the structure of FIGS. 1A and 1B in the step of FIGS. 2C and 2D, and the SiN film 13 is deposited on the structure thus obtained uniformly. By patterning the SiN film while using the resist pattern 14 explained with reference to FIG. 1B (not shown in FIGS. 2C and 2D), the SiN pattern 13A is formed. As explained before, the SiN pattern 13A includes the mask patterns 13a in the device array region 10A and further the mask openings 13c and 13c in the alignment mark formation region 10B.

Furthermore, in the step of FIGS. 2C and 2D, the SiN pattern 13A is used as a so-called hard mask, and the Si active layer 11C is patterned in the device array region 10A by a dry etching process. Simultaneously, the exposed part of the Si support substrate 11A is patterned in the alignment mark formation region 10B by the dry etching process. With this, the Si device regions 11c are formed in the region 10A in the state separated from each other by the device isolation grooves 11a. Further, the grooves 11b forming the alignment mark are formed in the alignment mark formation region 10B.

As can be seen from the cross-sectional view of FIG. 2D, the grooves 11b thus formed cut deeply into the support substrate 11A, and as a result, there is formed a step in the alignment mark by the groove 11b and the Si region 11d with a step height exceeding 500 nm. The step is detectable by an electron beam exposure apparatus. Because the grooves 11a defining the device region 11c and the grooves 11b defining the alignment mark are formed by the same mask pattern, the gate electrode is formed with an ideal positional alignment to the device region 11c.

FIGS. 3A–3D are diagrams explaining the principle of a second implementing mode of the present invention, wherein those parts explained previously are designated by the same reference numerals and the description thereof will be omitted.

Figure 3A:
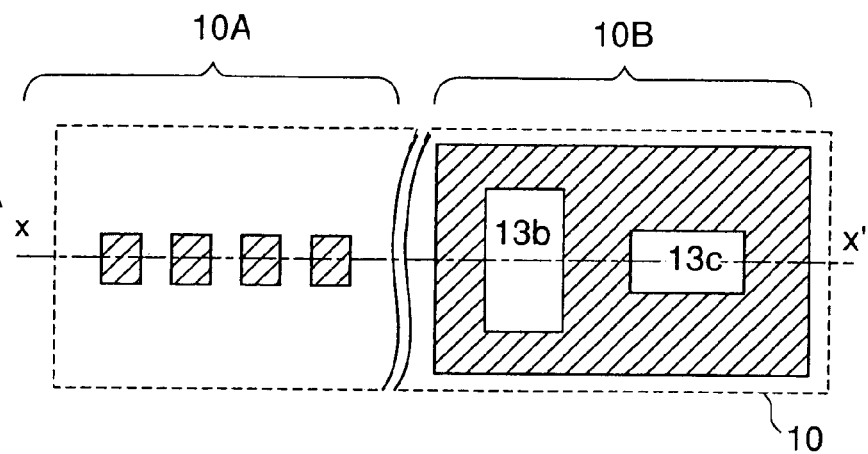
FIGS. 3A–3D are other diagrams showing the principle of the present invention.
Figure 3B:
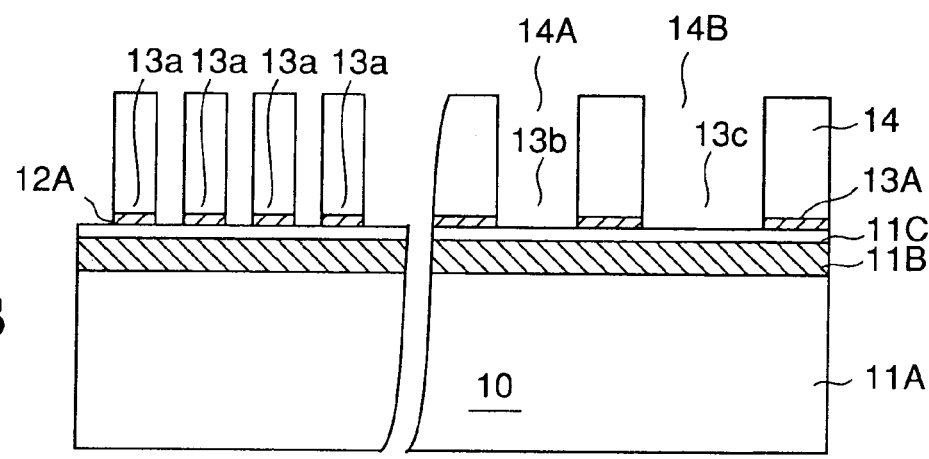

Referring to FIGS. 3A and 3B, a resist pattern 14 similar to the one explained previously with reference to FIG. 1B is formed on the structure, which is similar to the one explained previously with reference to FIG. 1A, and the SiN film 13 and also the said $SiO_2$ film 12 underneath the SiN film 13 are patterned while using the resist pattern 14 as a mask, and as a result, there are formed the SiN patterns 13A and also the $SiO_2$ patterns 12A such that, in the device array region 10A, the active layer 11C is exposed between the patterns 13a constituting the SiN patterns 13A, and such that, in the alignment mark formation region 10B, the active layer 11C is exposed at the openings 13b and 13c that are formed in the SiN pattern 13A respectively corresponding to the resist openings 14A and 14B. In the structure of FIGS. 3A and 3B, it should be noted that the thickness of the active layer 11C is set smaller, to the value of 100–150 nm, in correspondence to the device miniaturization, similarly to the case of FIGS. 2A and 2B. On the other hand, the $SiO_2$ buried insulation layer 11B has a thickness of about 400 nm. FIG. 3B is a sectional view taken along the line x–x' of FIG. 3.

Figure 3C:
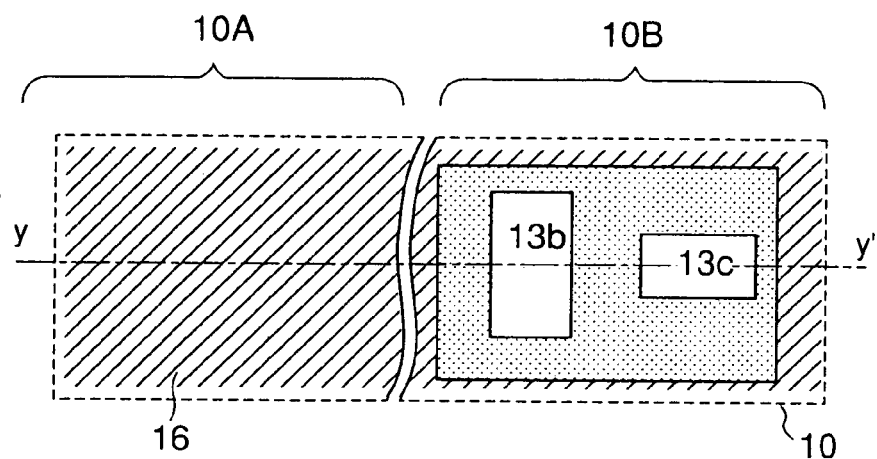
Figure 3D:
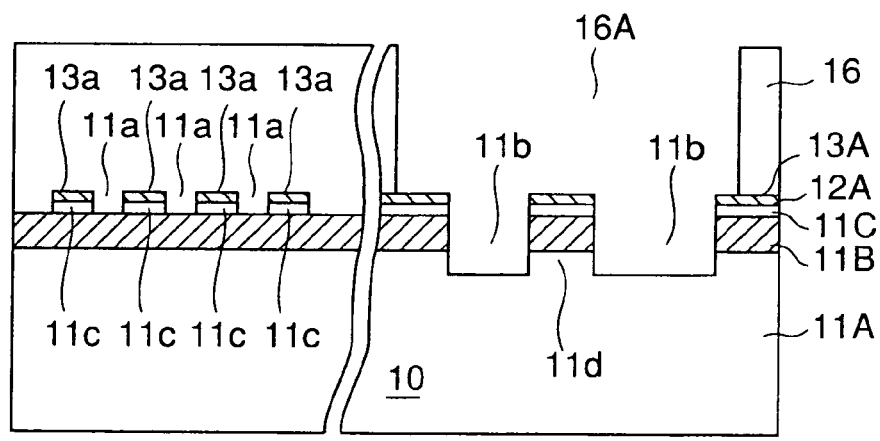

Next, in the step of FIGS. 3C and 3D, the active layer 11C is patterned while using the resist pattern 14 as a mask, and the device regions 11c are formed in the device array region 10A in the state covered with the SiN pattern 13A and also the SiO2 pattern 12A. Simultaneously, the active layer 11C is patterned in the alignment mark formation region 10B in correspondence to the resist opening, and hence in correspondence to the openings 13b and 13c in the SiN pattern 13A, and the SiO2 buried insulation layer 11B is exposed.

In the step of FIGS. 3C and 3D, the resist pattern 14 is removed and the resist pattern 16 explained previously with reference to FIG. 1I is formed on the structure thus patterned. Furthermore, the SiO2 buried insulation layer 11B and also the Si support substrate 11A underneath are patterned in the resist opening 16A that exposes the alignment mark formation region 10B formed in the resist pattern 16 by a dry etching process while using the SiN pattern 13A as a hard mask, such that the grooves 11b are formed in correspondence to the SiN film openings 13b and 13c as an alignment mark. It should be noted that the alignment mark thus formed has a step height satisfying the requirement imposed to the alignment mark for use in electron beam exposure process of at least 500 nm in view of the fact that the $SiO_2$ buried insulation layer 11B has the thickness of 400 nm and the Si active layer 11C have the thickness of 100 nm. In the alignment mark of the present implementing mode, the value of the step height becomes larger than that of the previous mode by the amount of the $SiO_2$ buried insulation layer 11B and also the Si active layer 11C.

In the present mode, too, the same mask is used for forming the device region 11c and the groove 11b in the alignment mark, and thus, the gate electrode is formed with an ideal positional alignment with respect to the device region 11c.

Next, the principle of the third mode of the present invention will be explained with reference to FIGS. 4A–4D, wherein those parts in the drawings explained previously are designates with the same reference numerals and the explanation thereof will be omitted.

Figure 4A:
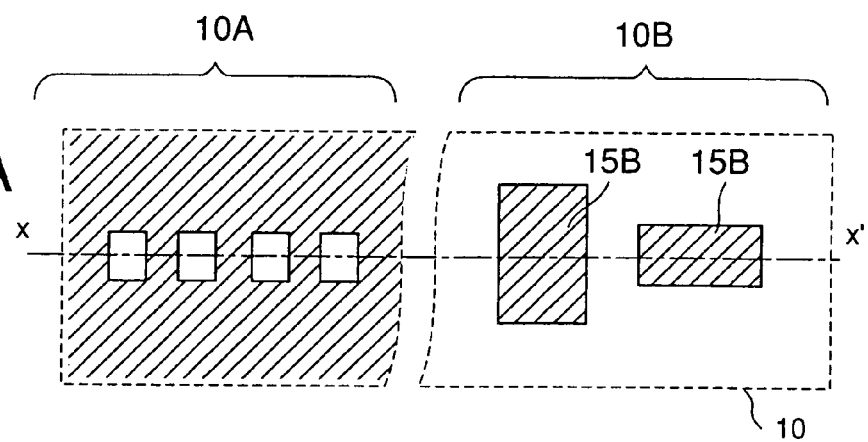
FIGS. 4A–4D are further diagrams showing the principle of the present invention.
Figure 4B:
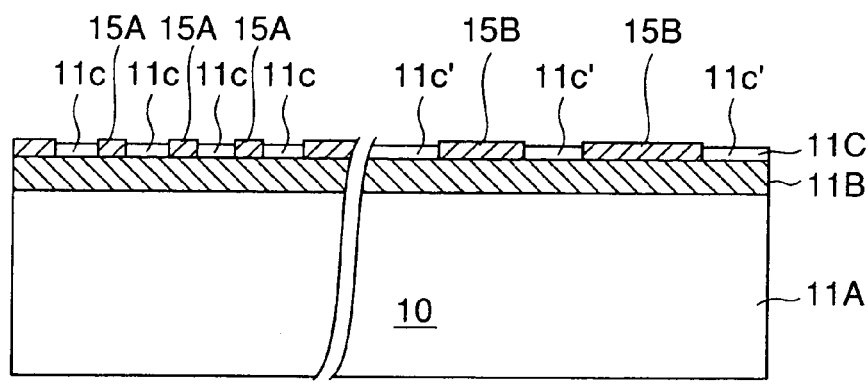

Referring to FIGS. 4A and 4B, the device regions 11c are formed in the device array region 10A of the SOI substrate 10, in which the $SiO_2$ buried insulation layer 11B having a thickness of about 400 nm and the Si active layer 11C having a thickness of about 100 nm are formed consecutively on the Si support substrate 11A similarly to the mode of FIGS. 2A and 2B explained previously, such that the device regions 11c are separated from each other with a mutual separation provided by the device isolation grooves, by conducting a patterning of the Si active layer 11C while using the resist pattern 14 of FIG. 1B not illustrated. In the step of FIGS. 4A and 4B, the device isolation grooves are filled by $SiO_2$ device isolation film patterns 15A. In the alignment mark formation region 10B, on the other hand, $SiO_2$ patterns 15B are formed in correspondence to the resist openings 14A and 14B in the resist pattern 14, and there are further formed Si patterns 11c' between the $SiO_2$ patterns 15B and 15B as a result of patterning of the Si active layer 11C. It should further be noted that the Si patterns 11c' have a form corresponding to the SiN opening 13b or 13c.

Figure 4C:
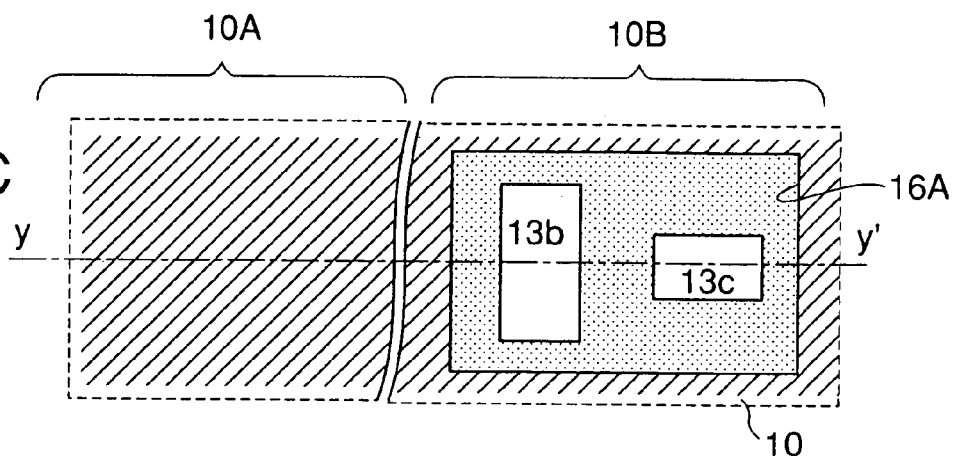
Figure 4D:
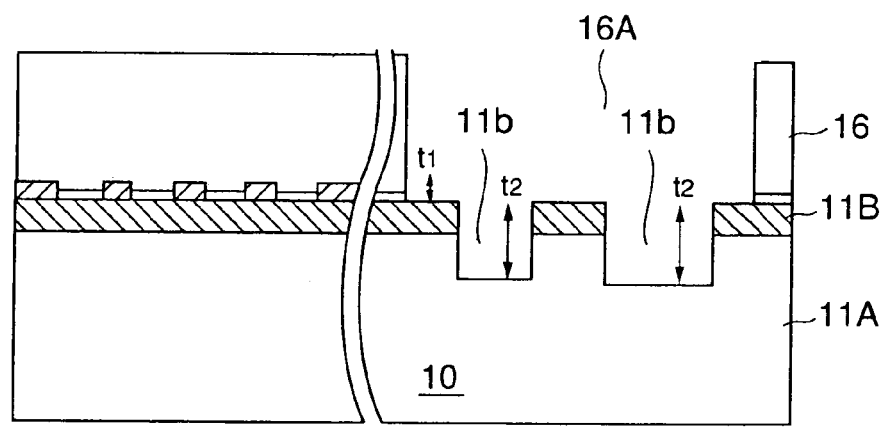

Next, in the step of FIG. 4C, the resist pattern 16 of FIG. 1H is formed on the structure of FIGS. 4A and 4B, and the $SiO_2$ pattern 15B and the $SiO_2$ buried insulation layer 11B underneath the $SiO_2$ pattern 15B are removed by a dry etching process while using the Si pattern 11c' as a mask, to form the grooves 11b in the insulation layer 11B in correspondence to the resist opening 16A such that the grooves 11b cut into the support substrate 11A and as an alignment mark.

In such a construction, too, it is easy to form the grooves 11b to the depth exceeding 500 $\mu$m, which depth enables proper alignment of an electron beam exposure apparatus.

In this mode, too, the gate electrode is formed with an ideal positional alignment to the device region 11c in view of the fact that the mask pattern 11c used when forming the grooves 11b is formed simultaneously to the device region 11c in the step of FIGS. 4A and 4B.

[First Embodiment]

Figure 5G:
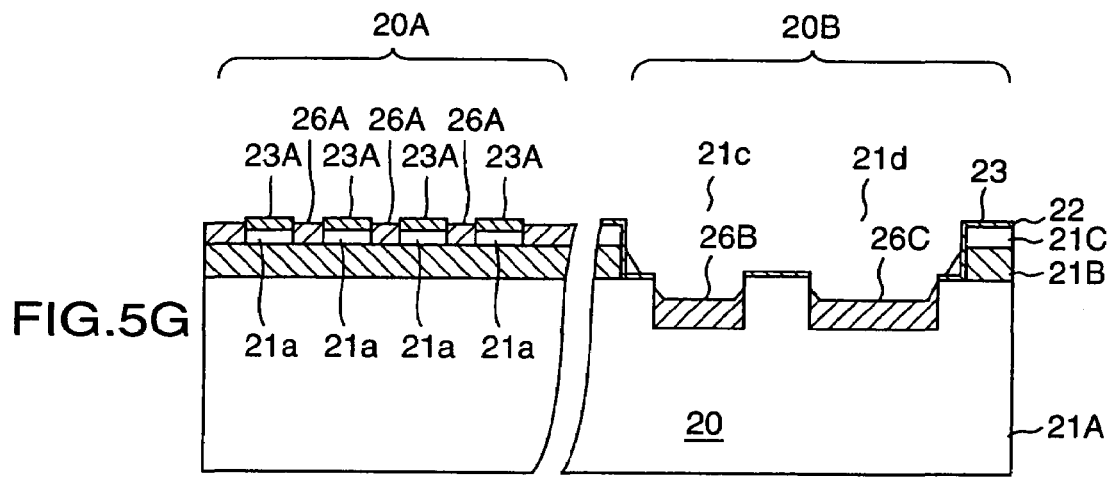

Next, the fabrication process of a semiconductor device according to a first embodiment of the present invention will be explained with reference to FIGS. 5A–5K, wherein it should be noted that FIG. 5A is a cross-sectional view taken along a line x–x' of FIG. 5B, while FIG. 5C is a cross-sectional view taken along a line x–x' of FIG. 5D.

Referring to FIG. 5A, the SOI substrate 20 may be formed by a process such as a SIMOX process and includes a Si support substrate 21A on which an $SiO_2$ buried insulation layer 21B is formed with a thickness of about 400 nm. Further, an active layer 21C of single crystal Si is formed on the $SiO_2$ buried insulation layer 21B with a thickness of about 150 nm. On the SOI substrate 20, there are formed a device array region 20A and an alignment mark formation region 20B such that a device region and a device isolation region are formed in the device array region 20A and an alignment mark is formed in the alignment mark formation region 20B. Also, an $SiO_2$ film 22 having a thickness of about 10 nm is formed on the active layer 21C by a hydrochloric acid oxidation process conducted at 900° C.

In the process of FIG. 5A, there is formed a resist pattern 24 on the SOI substrate 20 with an opening 24A corresponding to the alignment mark formation region 20B, and a structure in which the Si support substrate 21A is exposed as shown in FIG. 5A is formed by consecutively removing the $SiO_2$ film 22, the Si active layer 21C and the $SiO_2$ buried insulation layer 21B underlying the Si active layer 1C by a dry etching process in the resist opening 24A while using the resist pattern 24 as a mask. The dry etching process of the $SiO_2$ film 22 and also the $SiO_2$ buried insulation layer 21B my be conducted by using a mixed gas of $CHF_3/CF_4$ as the etching gas, by supplying $CHF_3$ and $CF_4$ with respective flow rates of 20 ml/min and 33 ml/min. On the other hand, the dry etching of the Si active layer 21C can be achieved by supplying a $Cl_2$-containing gas as an etching gas, with a flow rate of the $Cl_2$ gas of 156 sccm.

Next, in the step of FIGS. 5C and 5D, the resist pattern 24 is removed and an SiN film 23 is deposited so as to cover continuously the $SiO_2$ layer 22 in the device array region 20A and further the exposed support substrate 21A in the alignment mark formation region 20B. Further, in the step of FIGS. 5C and 5D, a resist pattern 25 is formed on the SiN film 23 such that the resist pattern 25 has a resist opening 25A corresponding to the device isolation region in the device array region 20A and resist openings 25B and 25C in the alignment mark formation region 20B in correspondence to the alignment marks to be formed. Further, the SiN film 23 and the $SiO_2$ film 22 underlying the SiN film 23 are patterned while using the resist pattern 25 as a mask. With this, the SiN openings 23B and 23C are formed so as to expose the SiN pattern 23A in the device array region 20A and the support substrate 21A in the alignment mark formation region 20B. As a result of such a patterning process, the active layer 21C is exposed in the device array region 20A except for the part in which the SiN patterns 23A are formed.

Next the resist pattern 25 is removed in the step of FIG. 5E, and the exposed Si active layer 21C or the support substrate 21A is patterned by a dry etching process that uses a $Cl_2$-containing gas as an etching gas while using the SiN pattern 23A as a mask in the device array region 20A and by using the SiN film 23 formed with the SiN openings 23B and 23C as a mask in the alignment mark formation region 20B. Thus, it is possible to form the device regions 21a in the device array region 20A in a state mutually separated from each other by the device isolation grooves 21b. Also, the grooves 21c' and 21d constituting the alignment mark in the alignment mark formation region 20B are formed in the form corresponding to the openings 23B and 23C. Thereby, it should be noted that the dry etching process used for forming the device isolation grooves 21b stops spontaneously upon exposure of the $SiO_2$ buried insulation layer 21B. As for the grooves 21c and 21d, on the other hand, there exist no etching stopper layer, and the grooves 21c and 21d penetrate deeply into the support substrate 21A and a step height exceeding 500 µm is formed.

Next, in the step of FIG. 5F, an $SiO_2$ film 26 is deposited on the structure of FIG. 5E by a CVD process with a thickness of about 500 nm, and the $SiO_2$ film 26 thus deposited is removed by polishing, by conducting a CMP process until the SiN layer 23 is exposed. As a result, a structure in which the device isolation grooves 21b are filled with the $SiO_2$ device isolation layer 26A is obtained as shown in FIG. 5G. In the state of FIG. 5G, it should be noted that the grooves 21c and 21d forming the alignment mark are also filled partially by the $SiO_2$ patterns 26B and 26C originating from the $SiO_2$ film 26.

Figure 5H:
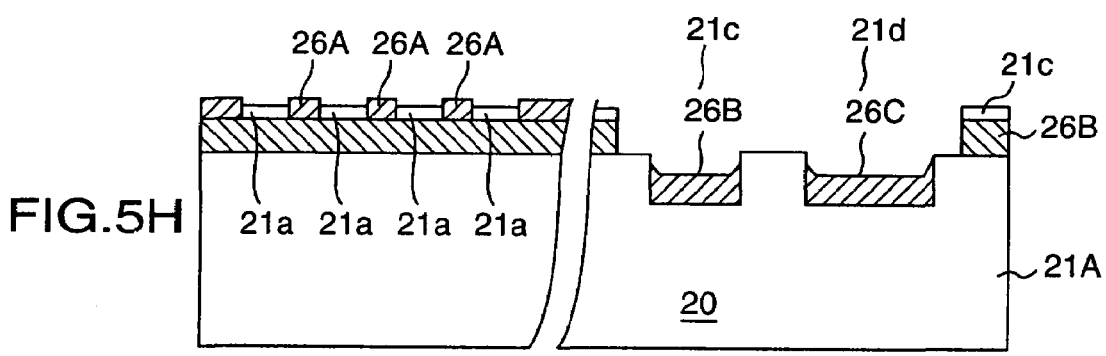

Thus, by removing the SiN patterns 23A and also the SiN layer 23 in the step of FIG. 5H by processing the structure of FIG. 5G in a pyrolytic phosphoric acid solution, followed by an isotropic etching process conducted in a HF aqueous solution, the $SiO_2$ pattern under the SiN film 23A is removed. In this process, etching of the $SiO_2$ patterns 26B and 26C takes place also in the alignment mark formation region 20B with an amount of about 10 nm.

Figure 5I:
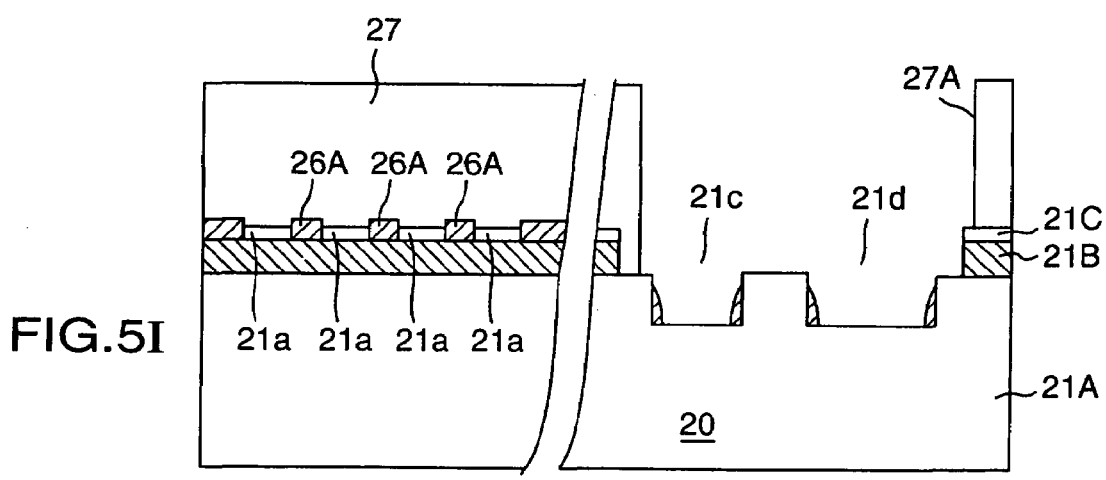

Further, a resist pattern 27 identical with the resist pattern 24 used in the step of FIG. 5A and having a resist opening 27A exposing the alignment mark formation region 20B is formed on the structure of FIG. 5H, and a structure shown in FIG. 5I exposing the grooves 21c and 21d is obtained by removing the $SiO_2$ patterns 26B and 26C by a dry etching process in the opening 27A. In the structure of FIG. 5I, it should be noted that there remain sidewall insulation films originating from the $SiO_2$ pattern 26B or 26C on the sidewalls of the grooves 21c or 21d. In the structure of FIG. 5I, it should be noted that the grooves 21c and 21d are exposed as the alignment marks except for the part covered with the sidewall insulation films.

Next, in the step of FIG. 5J, there is formed a thin $SiO_2$ film 28 having a thickness of several nanometers or less, such as 3.5 nm, on the surface of the Si device region 21a in the structure of FIG. 5I by causing an oxidation in a HCl atmosphere. Further, and a polysilicon layer 29 is formed thereon by a CVD process with a thickness of about 180 nm. Although there is formed a thin $SiO_2$ film also in the alignment mark formation region 20B in correspondence to the $SiO_2$ film 28 as a result of the oxidation process conducted in the HCl atmosphere in the step of FIG. 5J, illustration of this thin $SiO_2$ film is omitted for the sake of simplicity.

Next, in the step of FIG. 5K, a resist film is formed on the device array region 20A of the structure of FIG. 5J, and the structure thus obtained is introduced into an electron beam exposure apparatus. Further, exposure of the resist film is conducted in accordance with the gate electrode pattern to be formed while detecting the signals corresponding to the steps of the alignment marks 21c and 21d, by measuring the reflection electron intensity from the alignment mark formation region 20B and further by using the signals as a reference as shown in FIG. 5L.

By developing the resist film thus exposed, a resist pattern 30 corresponding to the gate electrode pattern is formed on the Si device region 21a as shown in FIG. 5K, and a gate electrode pattern 29A is formed in correspondence to the resist pattern while using the resist pattern 30 as a mask, by patterning a polysilicon layer 29 by a dry etching process that uses a $Cl_2/O_2$ mixed gas as an etching gas. In the step of FIG. 5K, it should be noted that the polysilicon layer 29 is actually removed from the alignment mark formation region 20B as a result of the patterning process of the polysilicon layer 29. In order to show the detection process of the alignment mark shown in FIG. 5L, however, the illustration of the polysilicon layer 29 is left in FIG. 5K. This is just for the sake of convenience.

According to the present embodiment, the grooves 21c and 21d can be formed to an arbitrary depth by merely increasing the dry etching time in the step of FIG. 5E. It should be noted that there occurs no penetration of the grooves 21b into the $SiO_2$ buried insulation layer in the device array region 20A even if a large etching time is used because of the etching selectivity between a Si layer and an $SiO_2$ layer. Thus, in the step of FIG. 5E, the grooves 21c and 21d are easily formed to the depth of 500 nm or more, and it becomes possible to obtain a clear step detection signal shown in FIG. 5L in the step of FIG. 5K by using an electron beam exposure apparatus. As noted before, the grooves 21c and 21d are formed simultaneously with the device isolation groove 21b by using the same mask in the present embodiment. Thus, the gate electrode is formed on the device region 21a with an ideal positional alignment.

[Second Embodiment]

Next, a process of fabricating a semiconductor device according to a second embodiment of the present invention will be explained with reference to FIGS. 6A–6L, wherein those parts explained previously are designated by the same reference numerals and the description thereof will be omitted.

Referring to FIGS. 6A and 6B at first, an SiN film 23 is deposited on the SOI substrate 20 explained previously with reference to FIG. 5A in the present embodiment by a CVD process, and the like, so as to cover the $SiO_2$ film 22. Further, a resist pattern 25 explained previously with reference to FIG. 5C is formed on the SiN film 23. Further, the SiN film 23 and also the $SiO_2$ film 22 underneath the SiN film 23 are patterned by using the resist pattern as a mask, and as a result, there are formed the SiN patterns 23A in the device array region 20A and the openings 23B and 23C are formed in the SiN layer 23 in the alignment mark formation region 20B respectively in correspondence to the resist openings 25B and 25C. It should be noted that FIG. 6A is a cross-sectional view taken along a line X–X' of FIG. 6B.

In the state of FIGS. 6A and 6B, it should be noted that the Si active layer 21C is exposed in the device array region 20A except for the part in which the SiN pattern 23A is formed. Further, the Si active layer 21C is exposed in the alignment mark formation region 20B in correspondence to the openings 23B and 23C.

Thus, the resist pattern 25 is removed in the step of FIG. 6C and a large number of device regions 21a are formed in the manner separated from each other by the device isolation grooves 21c in the device array region 20A in correspondence to the SiN patterns 23A, by applying a selective dry etching process to the Si active layer 21C with respect to the $SiO_2$ buried insulation layer 21B underneath the Si active layer 21C while using the SiN layer 23 as a mask. On the other hand, the openings 21c and 21d respectively corresponding to the SiN opening 25B and 25C are formed in the alignment mark formation region 20B so as to expose the buried insulation layer 21B.

In the step of FIG. 6C, it should be noted that the height of the device region 21a and the depth of the openings 21c and 21d are equal.

Figure 6D:
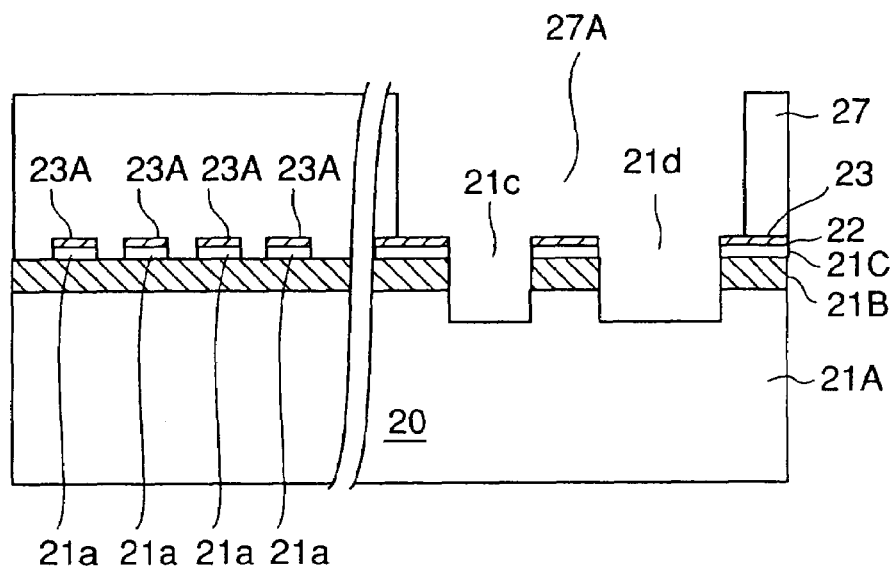
Figure 6E:
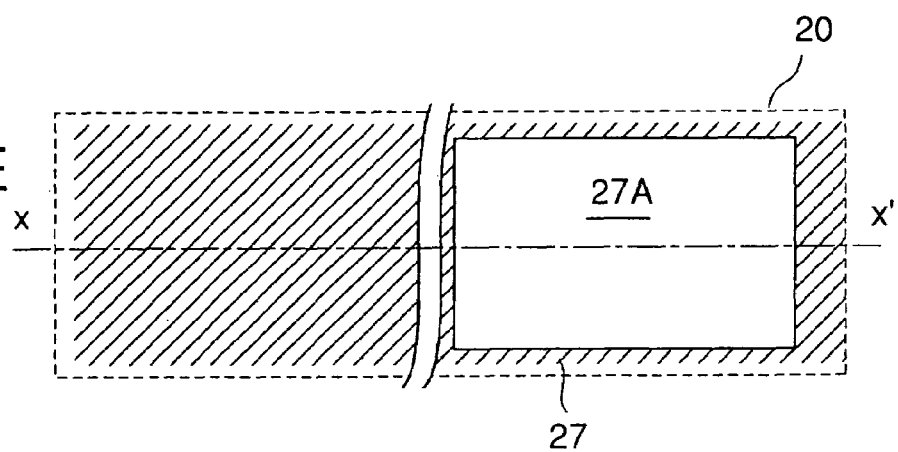

Next, in the steps of FIGS. 6D and 6E, a resist pattern 27 is formed on the structure of FIG. 6C, such that the resist pattern 27 has a resist opening 27A corresponding to the alignment mark formation region 20B used previously in the step of FIG. 5I, and the $SiO_2$ buried insulation layer 21B is subjected to a dry etching process in the alignment mark formation region 20B according to an etching recipe for an $SiO_2$ film, by using a $CHF_3/CF_4$ mixed gas as an etching gas and the resist pattern 27 as a mask, until the support substrate 21A is exposed in the part exposed by the SiN openings 23B and 23C. Further, the etching recipe is switched to the one used for etching an Si film, and the exposed Si support substrate 21A is subjected to a dry etching process by using a $Cl_2$-containing gas as an etching gas. As a result, the openings 21c and 21d extend further below in the downward direction and form the grooves that reach the support substrate 21A and further cut into the support substrate 21A. In FIGS. 6D and 6E, it should be noted that FIG. 6D is a cross-sectional view taken along a line x–x' of FIG. 6E.

Naturally, the grooves 21c and 21d have a depth far exceeding the height of the device regions 21a, and thus, a step height exceeding the value of 500 nm, which is required for the alignment mark in an electron beam exposure apparatus, is obtained easily, in the case the active layer 21C has a thickness of 100 nm and the buried $SiO2$ layer 21B has a thickness of 400 nm.

Figure 6F:
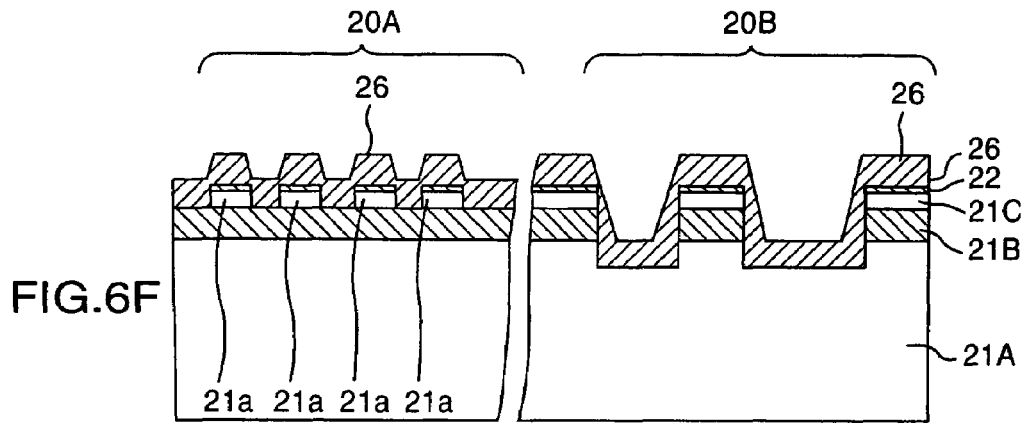
Figure 6G:
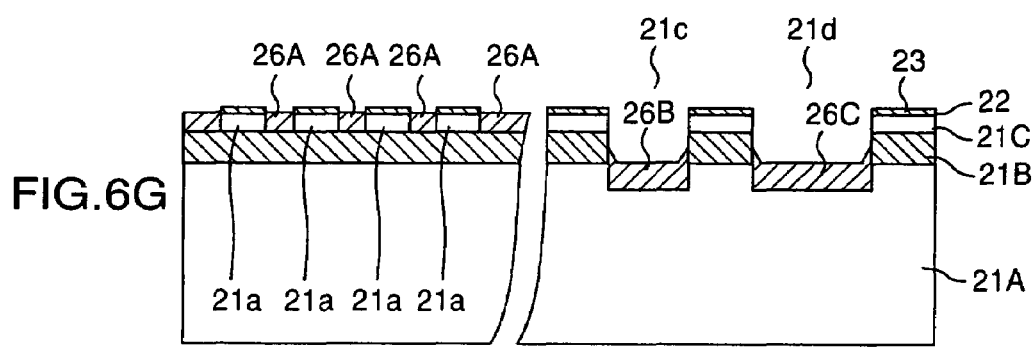

Next, the resist pattern 27 is removed in the step of FIG. 6F, and an $SiO_2$ film 26 is deposited on the structure of FIG. 6D by a CVD process to a thickness of about 500 nm, and the $SiO_2$ film 26 thus deposited is polished and removed by a CMP process until the SiN layer 23 is exposed. As a result, a structure in which the device isolation groove 21b is filled with the $SiO_2$ device isolation layer 26A is obtained as shown in FIG. 6G. In the state of FIG. 6G, it should be noted that the grooves 21c and 21d forming the alignment mark are also filled partially with $SiO_2$ patterns 26B and 26C, which originate from the $SiO_2$ film 26.

Figure 6H:
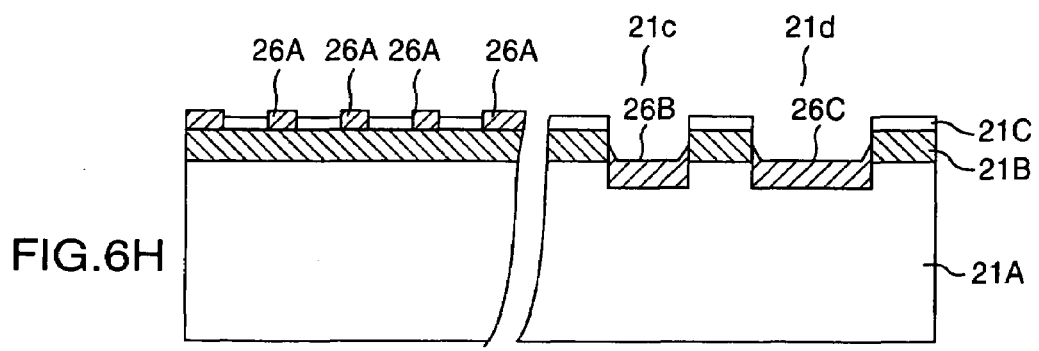

Thereupon, the SiN pattern 23A and the SiN layer 23 are removed by processing the structure of FIG. 6G in a pyrolytic phosphoric acid solution in the step of FIG. 6H, and the $SiO_2$ layer 22 underneath the SiN film 23 is removed by applying an isotropic etching process in a HF aqueous solution. In this step, there occurs an etching of the $SiO_2$ patterns 26B and 26C also in the alignment mark formation region 20B with an amount of about 10 nm. This effect, however, is not illustrated.

Figure 6I:
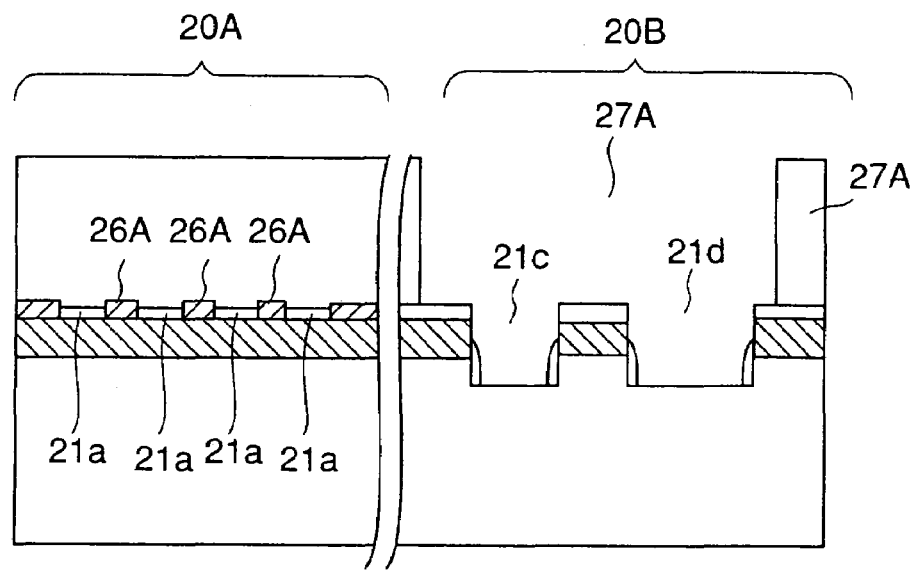
Figure 6J:
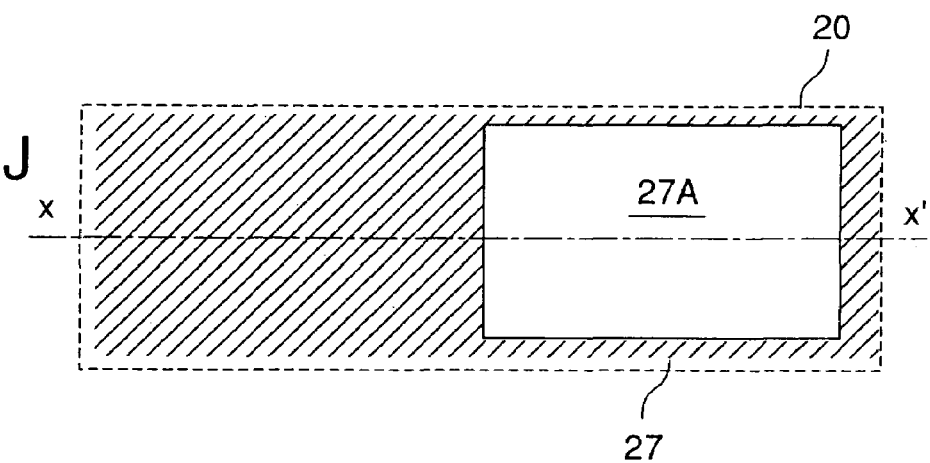

Next, in the step of FIGS. 6I and 6J, a resist pattern 27, substantially identical with the resist pattern 24 used in the step of FIG. 6D and having a resist opening 27A exposing the alignment mark formation region 20B, is formed on the structure of said FIG. 6H, and a structure shown in FIG. 6I in which the grooves 21c and 21d are exposed is obtained by removing the $SiO_2$ patterns 26B and 26C by a dry etching process at the opening 27A. In the structure of FIG. 6I, it should be noted that there remain sidewall insulation films originating from the $SiO_2$ pattern 26B or 26C at the sidewalls of the grooves 21c or 21d. In the structure of FIG. 6I, the grooves 21c and 12d are exposed as the alignment mark, except for the part covered with the sidewall insulation films. It should be noted that FIG. 6I is a cross-sectional view taken along a line x–x' of FIG. 6J.

Further, in the step of FIG. 6K, there is grown a thin $SiO_2$ film 28 having a thickness of several nanometers or less, 3.5 nm for example, on the surface of the Si device region 21a in the structure of FIG. 6I by an oxidation process conducted in a HCl atmosphere, and a polysilicon layer 29 is grown thereon by a CVD process to a thickness of about 180 nm. In the step of FIG. 6K, the thin $SiO_2$ film 28 is formed also in the alignment mark formation region 20B on the surface of the exposed Si active layer 21C or the support substrate 21A as a result of the oxidation process in the HCl atmosphere.

Next, in the step of FIG. 6L, a resist film is formed on the device array region 20A of the structure of FIG. 6K, and the structure thus obtained is introduced into an electron beam exposure apparatus. Further, the reflection electron intensity from the alignment mark formation region 20B is measured as shown in FIG. 6M, and the signals corresponding to the step height of the alignment marks 21c and 21d are detected. By using the signals thus obtained as a reference, the resist film is patterned according to the gate electrode pattern to be formed.

By developing the exposed resist film, a resist pattern 30 corresponding to the gate electrode pattern is formed on the Si device region 21a as shown in FIG. 6L, and the gate electrode pattern 29A is formed in correspondence to the resist pattern 30 by patterning the polysilicon layer 29 by a dry etching process typically using a $Cl_2/O_2$ mixed gas as etching gas while using the resist pattern 30 as a mask. In the step of FIG. 6L, it should be noted that the polysilicon layer 29 is removed in the alignment mark formation region 20B as a result of the patterning of the polysilicon layer 29. In FIG. 6L, however, the illustration of the polysilicon layer 29 is left as it is just for the sake of convenience to show the detection process of the alignment mark in FIG. 6M. Further, the illustration of the sidewall oxide films formed on the sidewalls of the grooves 21d and 21e of FIG. 6I is omitted in FIGS. 6K and 6L for the sake of simplicity.

In the present embodiment, it should be noted that the grooves 21c and 21d are formed so as to reach the Si support substrate 21A by crossing the active layer 21C and the SiO$_2$ buried insulation layer 21B underneath in the step of FIG. 6D. Thereby, the device array region 20A is protected by the resist pattern 27. Thus, there is no possibility that the buried insulation layer 21B is etched in the device isolation groove 21b. Thus, the grooves 21c and 21d formed in the step of FIG. 6D have a depth of 500 nm or more, and it becomes possible to obtain a clear step height detection signal shown in FIG. 6M by using an electron beam exposure apparatus 25 in the step of FIG. 6L. In the present embodiment, too, the grooves 21c and 21d and the device region 21a are formed simultaneously by using the same mask. Thus, the gate electrode is formed with an ideal positional alignment with respect to the device region 21c.

[Third Embodiment]

Next, the process of fabricating a semiconductor device according to a third embodiment of the present invention will be explained with reference to FIGS. 7A–7H, wherein those parts explained previously are designated by the same reference numerals and the description thereof will be omitted.

Figure 7A:
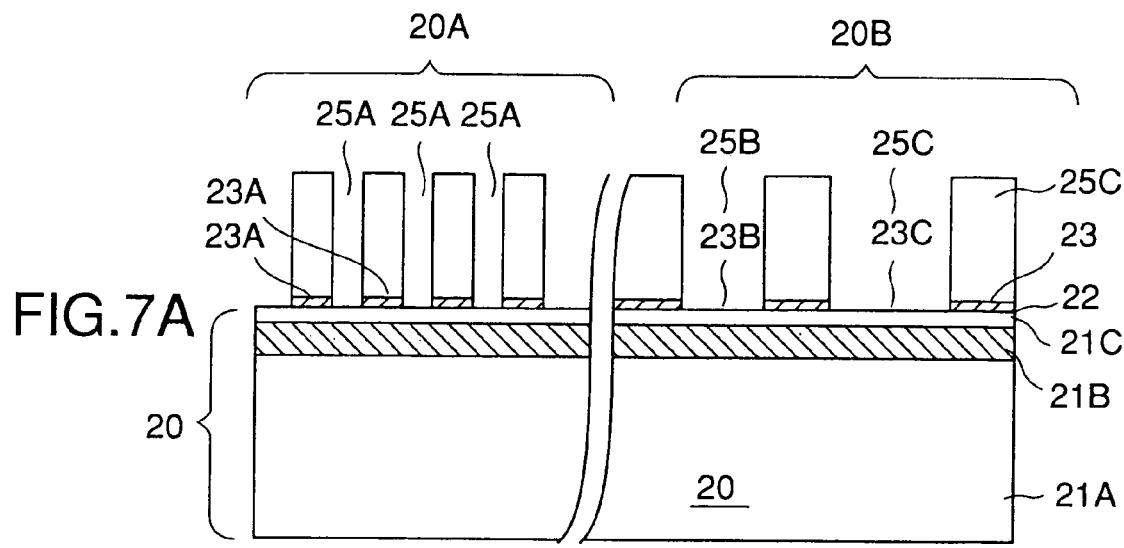
FIGS. 7A–7H are diagrams explaining the process of fabricating a semiconductor device according to a third embodiment of the present invention.
Figure 7B:
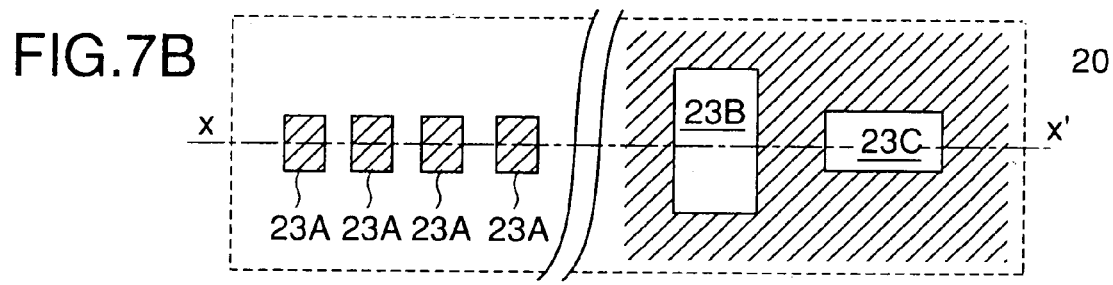
Figure 7C:
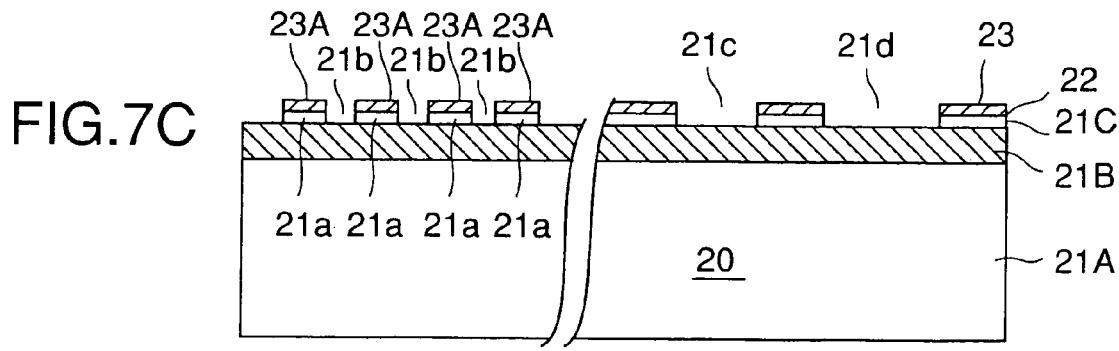
Figure 7D:
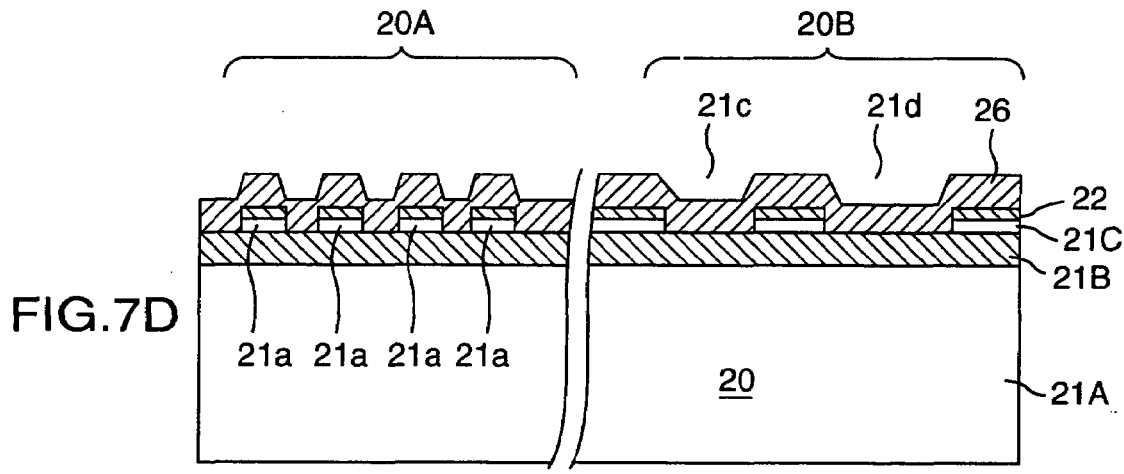

Referring to the drawings, The steps from FIGS. 7A to 7C are identical with the steps of FIGS. 6A to 6C of the previous embodiment, and the SiO$_2$ film 26 is deposited on the structure of FIG. 7C by a CVD process in the step of FIG. 7D so that the SiO$_2$ film 26 buries the device isolation trench 21b and also the grooves 21c and 21d.

Figure 7E:
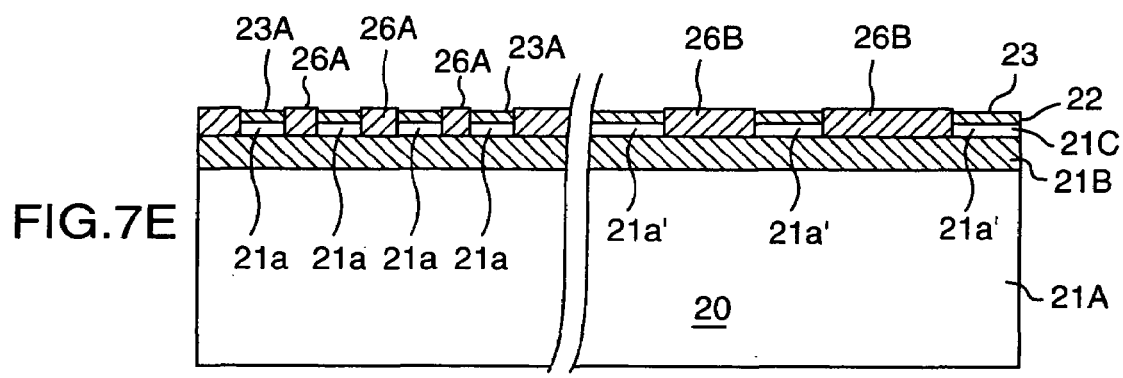

Further, in the step of FIG. 7E, the SiO$_2$ film 26 is removed by polishing, by using a CMP process, until the SiN film 23 or the SiN pattern 23A is exposed. As a result of the process of FIG. 7E, there is obtained a structure in which the device isolation grooves 21b formed between the device regions 21a (see FIG. 6C) are filled with the device isolation insulation film 26A originating from the SiO$_2$ film 26 in the device array region 20A and the grooves 21c and 21d are filled with the insulation film pattern 26B originating from the SiO$_2$ film 26 in the alignment mark formation region 20B. In the alignment mark formation region 20B, the Si patterns 21a' originating from the initial Si active layer 21C are formed between the adjacent insulation film patterns 26B.

Figure 7F:
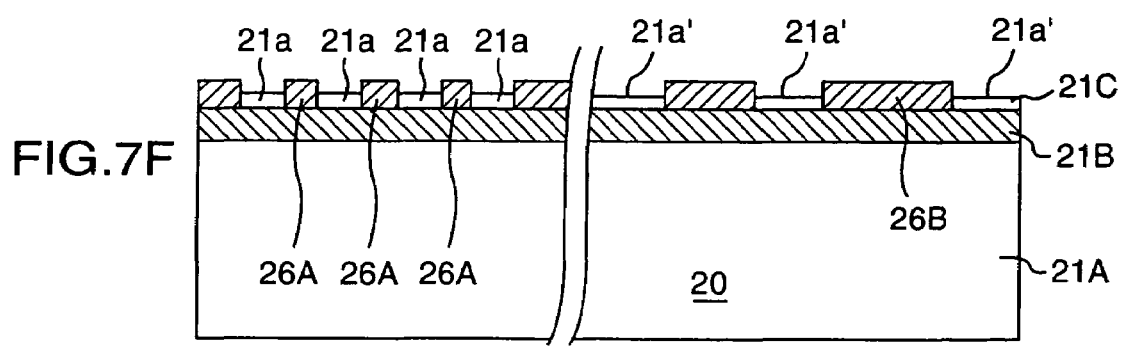
Figure 7G:
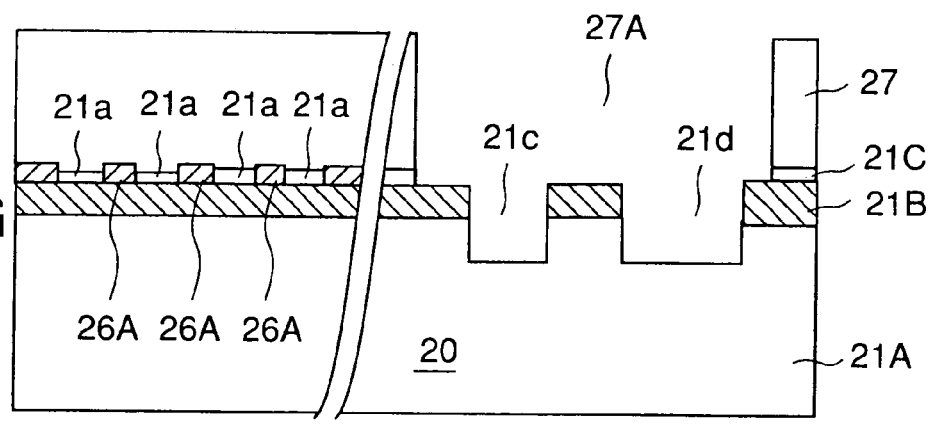
Figure 7H:
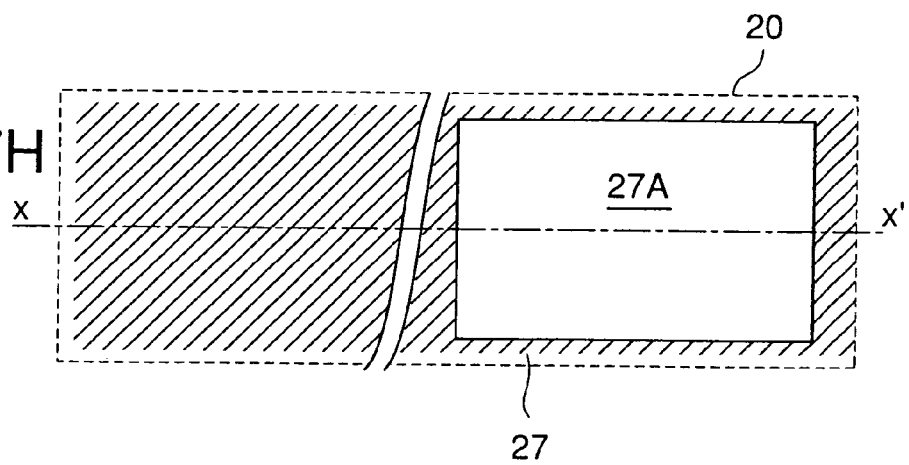

Thus, in the subsequent step of FIG. 7F, the SiN film 23, the SiN patterns 23A, the SiO$_2$ film 22 underneath thereof and further the SiO$_2$ patterns corresponding thereto, are removed from the structure of FIG. 7E by processing in a pyrolytic phosphoric acid solution, followed by processing in an HF solution. Next, in the step of FIG. 7G, a resist pattern 27 covering the device array region 20A is formed on the structure of FIG. 7F while using the mask that was used in the step of FIG. 6I. Further, the SiO$_2$ film pattern 26B and also the buried insulation layer 21B underneath thereof are subjected to a dry etching process in the opening 27A of the resist pattern 27 exposing the alignment mark formation region 20B, according to the recipe for etching an SiO$_2$ film, while using the Si pattern 21a' as a self-aligned mask. As a result, the grooves 21c and 21d are formed such that the support substrate 21A is exposed. Further, the dry etching recipe is switched to the recipe for etching a Si film, and the exposed Si support substrate 21A is subjected to a dry etching process while using the SiO$_2$ buried insulation layer 21B as a self-aligned mask. With this, the grooves 21c and 21d invade deeply into the support substrate 21A. In the device array region 20A, on the other hand, the device isolation insulation film 26A or the device region 21a is protected by the resist pattern 27. Thus, there occurs no formation of grooves invading into the SiO$_2$ buried insulation layer 21B even when such a dry etching process is conducted.

According to the present embodiment, it is easy to form the grooves 21c and 21d to the depth of 500 nm or more required for the alignment mark used in an electron beam exposure apparatus.

In the present embodiment, too, the grooves 21c and 21d and also the device region 21a are formed simultaneously by using the same mask. Thus, the gate electrode is formed with an ideal positional alignment with regard to the device region 21c.

Heretofore, the present invention was explained with regard to preferable embodiments. However, the present invention is not limited to such particular embodiments and various deformations and modifications may be made without departing from the scope of the invention.

INDUSTRIAL APPLICABILITY

According to the present invention, the device isolation grooves and the alignment marks are formed respectively on the device array region and the alignment mark formation region on the SOI substrate by using the same mask, such that a small aspect ratio is maintained for the device isolation grooves and such that the alignment mark has a depth sufficient for detection of the alignment marks in the electron beam exposure apparatus with high precision. As a result, it becomes possible to fill the device isolation grooves with the device isolation insulation film positively, even in the case the semiconductor device is miniaturized to a pattern width of 0.2 μm or less, for improvement of the operational speed. Thereby, an ideal pattern alignment is achieved simultaneously to ideal device isolation.

What is claimed is:

1. A semiconductor device comprising:
   an SOI substrate comprising a support substrate, a buried insulation layer formed on said support substrate and a semiconductor layer formed on said buried insulation layer;
   a device insolation groove formed in a first region of said composite semiconductor substrate so as to expose said buried insulation layer;
   a device isolation insulation film filling said device isolation groove; and
   an alignment groove formed in a second region of said SOI substrate as an alignment mark so as to reach at least said support substrate.

2. A semiconductor device as claimed in claim 1, wherein said alignment groove extends to a location lower than a surface of said support substrate.

3. A semiconductor device as claimed in claim 1, wherein said buried insulation layer and said semiconductor layer are removed from a region in the vicinity of said alignment mark in said region, and wherein said alignment groove is formed in said support substrate.

4. A semiconductor device as claimed in claim 1, wherein said alignment groove penetrates at least said buried insulation layer and a part of said support substrate in said second region.

5. A semiconductor device as claimed in claim 1, wherein a said alignment groove penetrates through said semiconductor layer in said second region.

* * * * *